US012701934B2

(12) United States Patent
More

(10) Patent No.: US 12,701,934 B2

(45) Date of Patent: Aug. 4, 2026

(54) FIN STRUCTURE WITH REDUCED DEFECTS AND MANUFACTURING METHOD THEREOF

(71) Applicant: Taiwan Semiconductor Manufacturing Company, Ltd., Hsinchu (TW)

(72) Inventor: Shahaji B. More, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 125 days.

(21) Appl. No.: 17/452,673

(22) Filed: Oct. 28, 2021

(65) Prior Publication Data

US 2022/0359199 A1 Nov. 10, 2022

Related U.S. Application Data

(60) Provisional application No. 63/201,653, filed on May 7, 2021.

(51) Int. Cl.
| | |
|---|---|
| *H10P 14/20* | (2026.01) |
| *H10D 84/01* | (2026.01) |
| *H10D 84/03* | (2025.01) |
| *H10P 30/20* | (2026.01) |
| *H10P 50/64* | (2026.01) |

(52) U.S. Cl.
CPC ..... *H10P 14/3822* (2026.01); *H10D 84/0188* (2025.01); *H10D 84/0193* (2025.01); *H10D 84/038* (2025.01); *H10P 14/274* (2026.01);

*H10P 14/3411* (2026.01); *H10P 30/204* (2026.01); *H10P 30/21* (2026.01); *H10P 50/642* (2026.01)

(58) Field of Classification Search
CPC ......... H01L 21/02532; H01L 21/02694; H01L 21/02; H01L 21/02645
See application file for complete search history.

(56) References Cited

U.S. PATENT DOCUMENTS

| | | | | |
|---|---|---|---|---|
| 8,610,201 B1* | 12/2013 | Hokazono | ........... | H01L 27/0924 |
| | | | | 257/E29.267 |
| 2017/0125412 A1* | 5/2017 | Soong | ............... | H01L 21/31155 |
| 2017/0194496 A1* | 7/2017 | Lin | ..................... | H01L 29/7848 |

(Continued)

*Primary Examiner* — Kretelia Graham
*Assistant Examiner* — Adin Hrnjic
(74) *Attorney, Agent, or Firm* — Harrity & Harrity, LLP

(57) ABSTRACT

Implementations described herein provide a method that includes implanting a dopant and carbon in a portion of a substrate of a semiconductor device. The method also includes depositing a first silicon-based layer on the portion of the substrate, the first silicon-based layer reacting with the carbon to form a diffusion region on the portion of the substrate. The method further includes forming a recessed portion of the semiconductor device, the recessed portion extending through the first silicon-based layer and the diffusion region and partially extending into the portion of the substrate. The method additionally includes depositing a second silicon-based layer within the recessed portion. The method further includes etching one or more portions of the second silicon-based layer and the portion of the substrate to form a set of fin structures that include the second silicon-based layer and the portion of the substrate having the dopant and the carbon implanted.

20 Claims, 27 Drawing Sheets

(56) References Cited

U.S. PATENT DOCUMENTS

| 2017/0250183 A1* | 8/2017 | Brunco | H01L 21/76224 |
| 2020/0098879 A1* | 3/2020 | Lee | H01L 21/02433 |
| 2020/0135768 A1* | 4/2020 | Hung | H01L 29/66545 |
| 2022/0367200 A1* | 11/2022 | Chang | H10D 30/751 |

\* cited by examiner

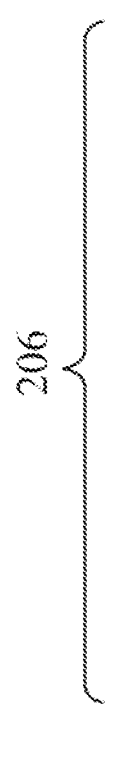
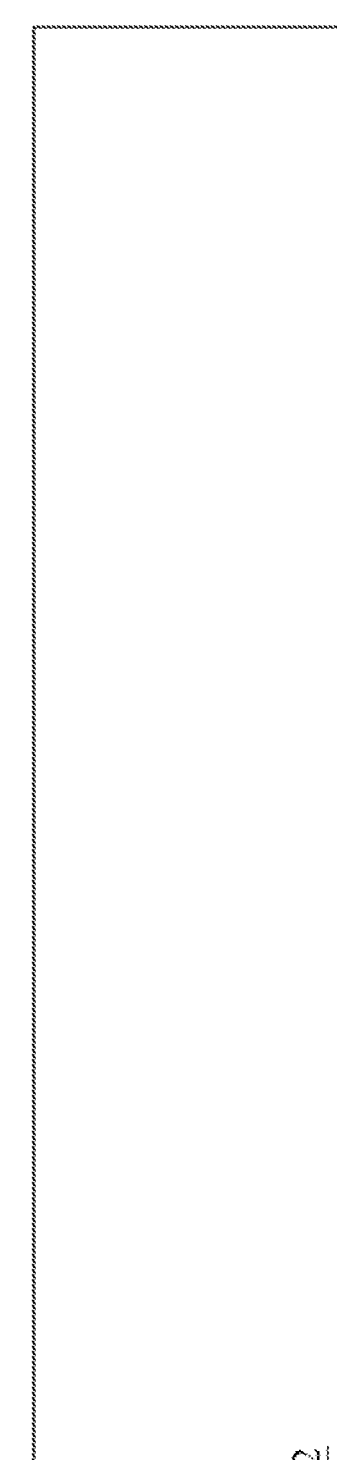
FIG. 2A

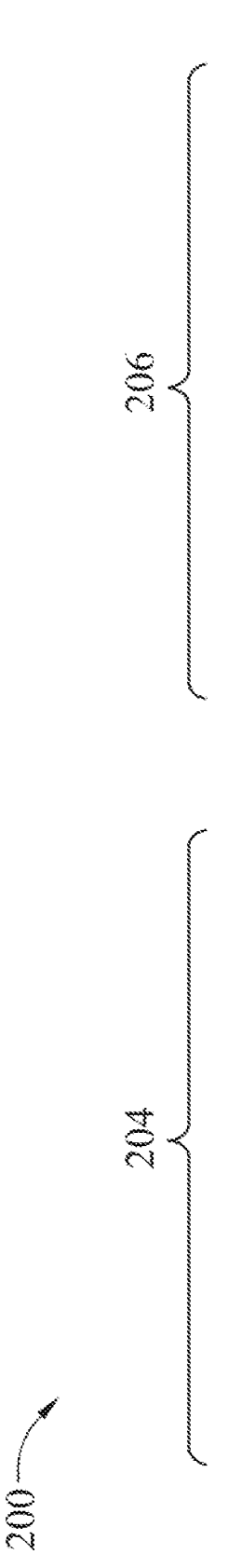
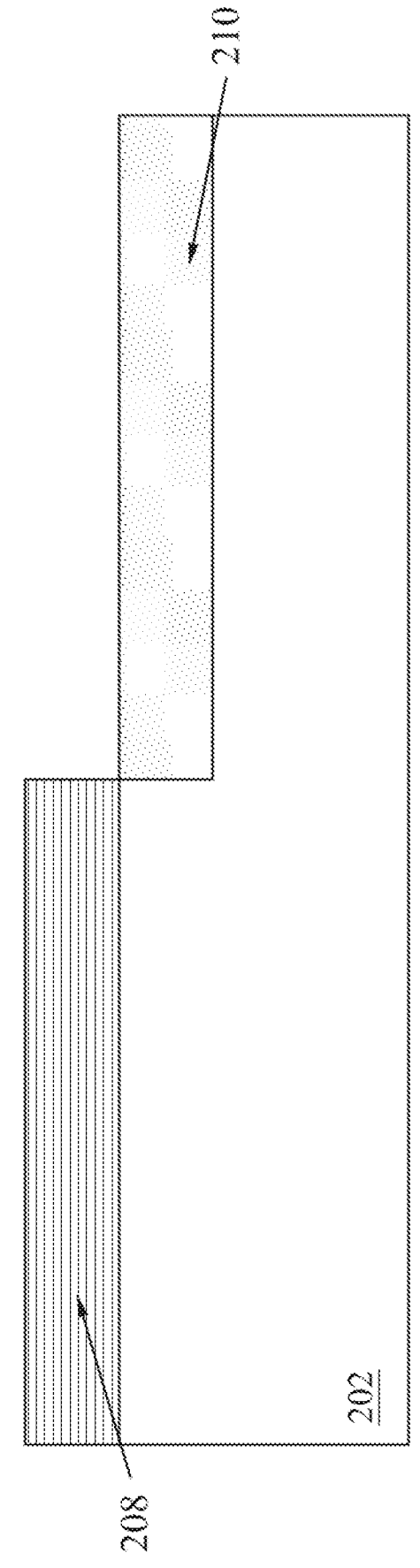
FIG. 2B

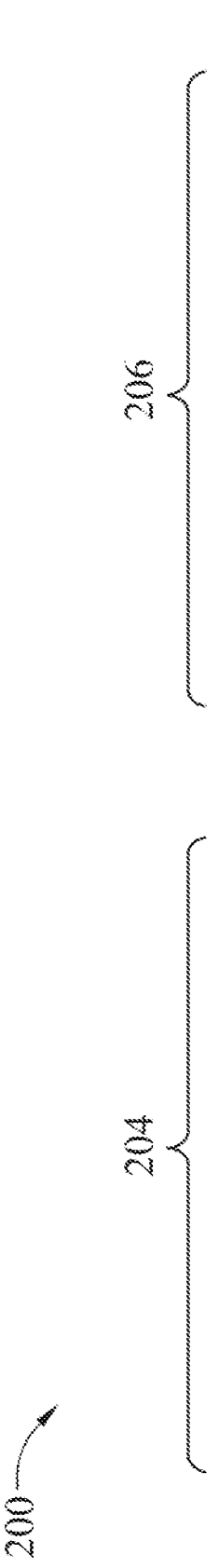
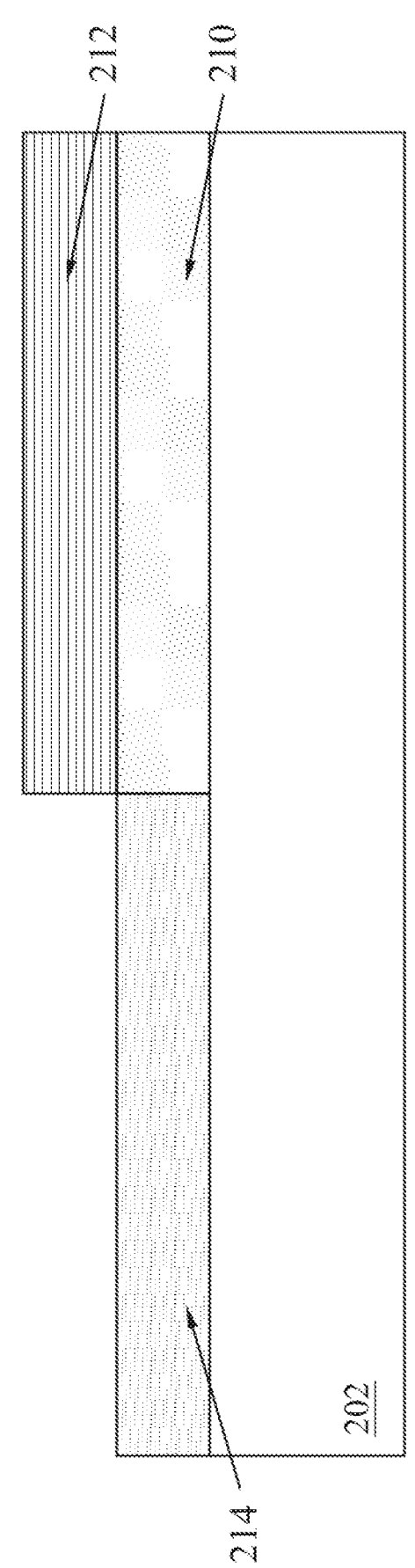
200
206
204
212
210
202
214
FIG. 2C

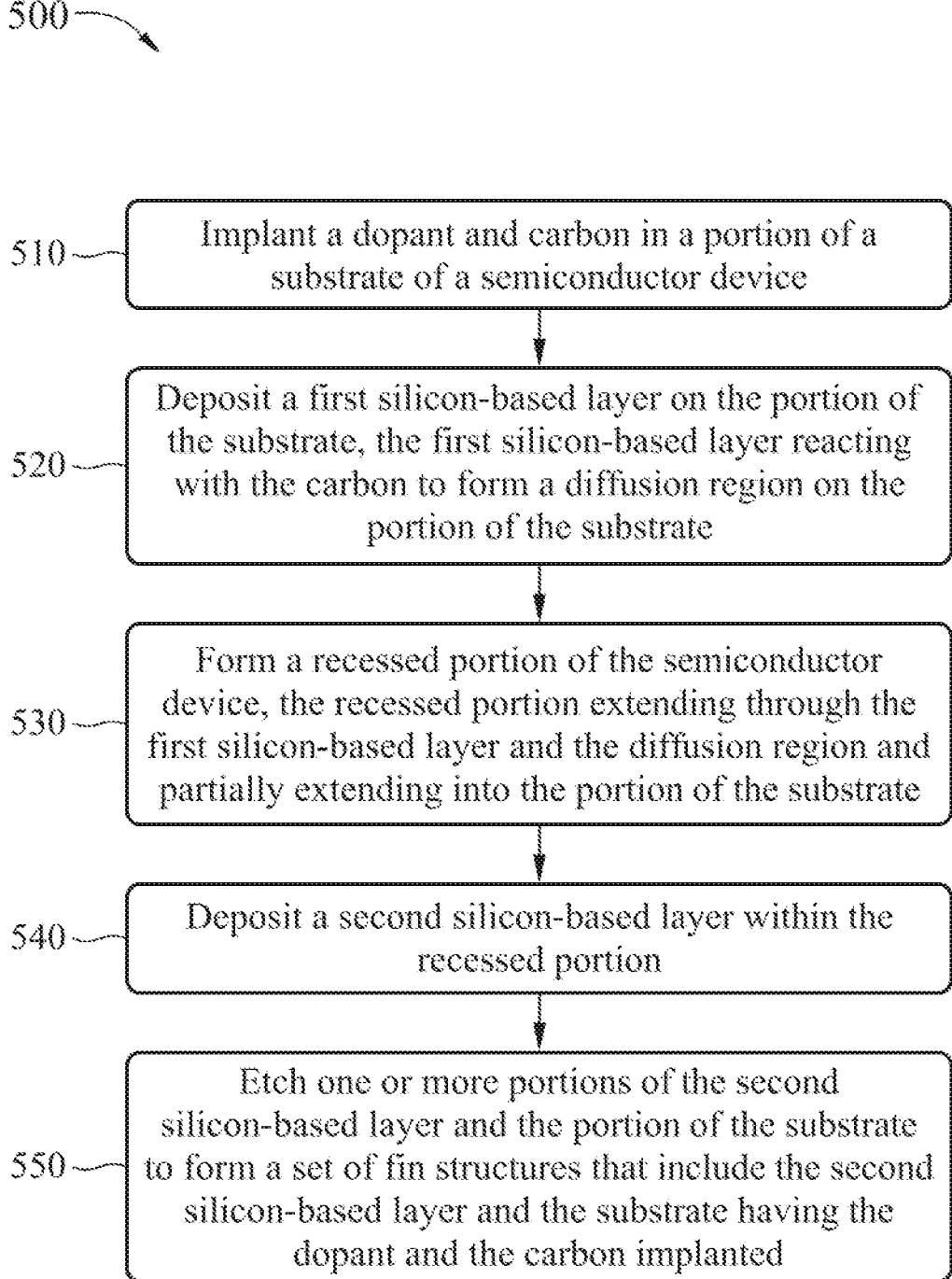

510 — Implant a dopant and carbon in a portion of a substrate of a semiconductor device 520 — Deposit a first silicon-based layer on the portion of the substrate, the first silicon-based layer reacting with the carbon to form a diffusion region on the portion of the substrate 530 — Form a recessed portion of the semiconductor device, the recessed portion extending through the first silicon-based layer and the diffusion region and partially extending into the portion of the substrate 540 — Deposit a second silicon-based layer within the recessed portion 550 — Etch one or more portions of the second silicon-based layer and the portion of the substrate to form a set of fin structures that include the second silicon-based layer and the substrate having the dopant and the carbon implanted

FIG. 5

600

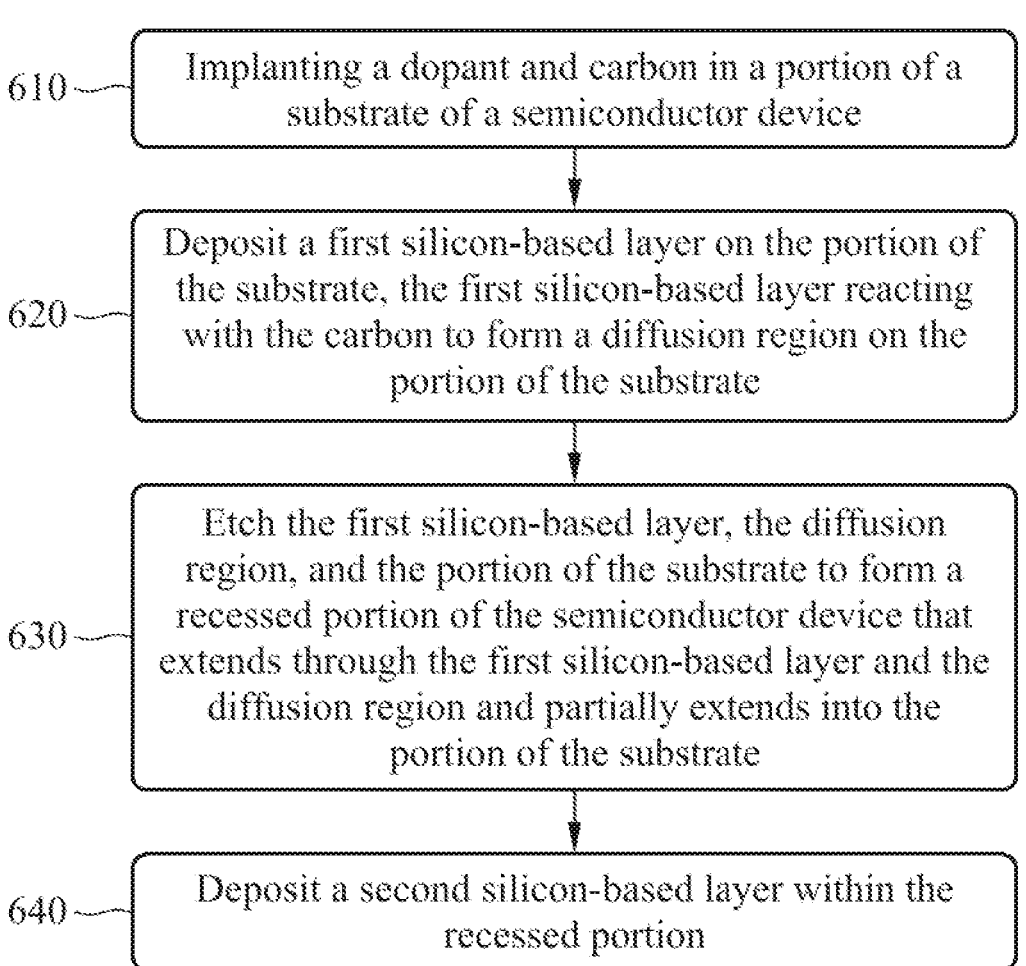

610 — Implanting a dopant and carbon in a portion of a substrate of a semiconductor device 620 — Deposit a first silicon-based layer on the portion of the substrate, the first silicon-based layer reacting with the carbon to form a diffusion region on the portion of the substrate 630 — Etch the first silicon-based layer, the diffusion region, and the portion of the substrate to form a recessed portion of the semiconductor device that extends through the first silicon-based layer and the diffusion region and partially extends into the portion of the substrate 640 — Deposit a second silicon-based layer within the recessed portion

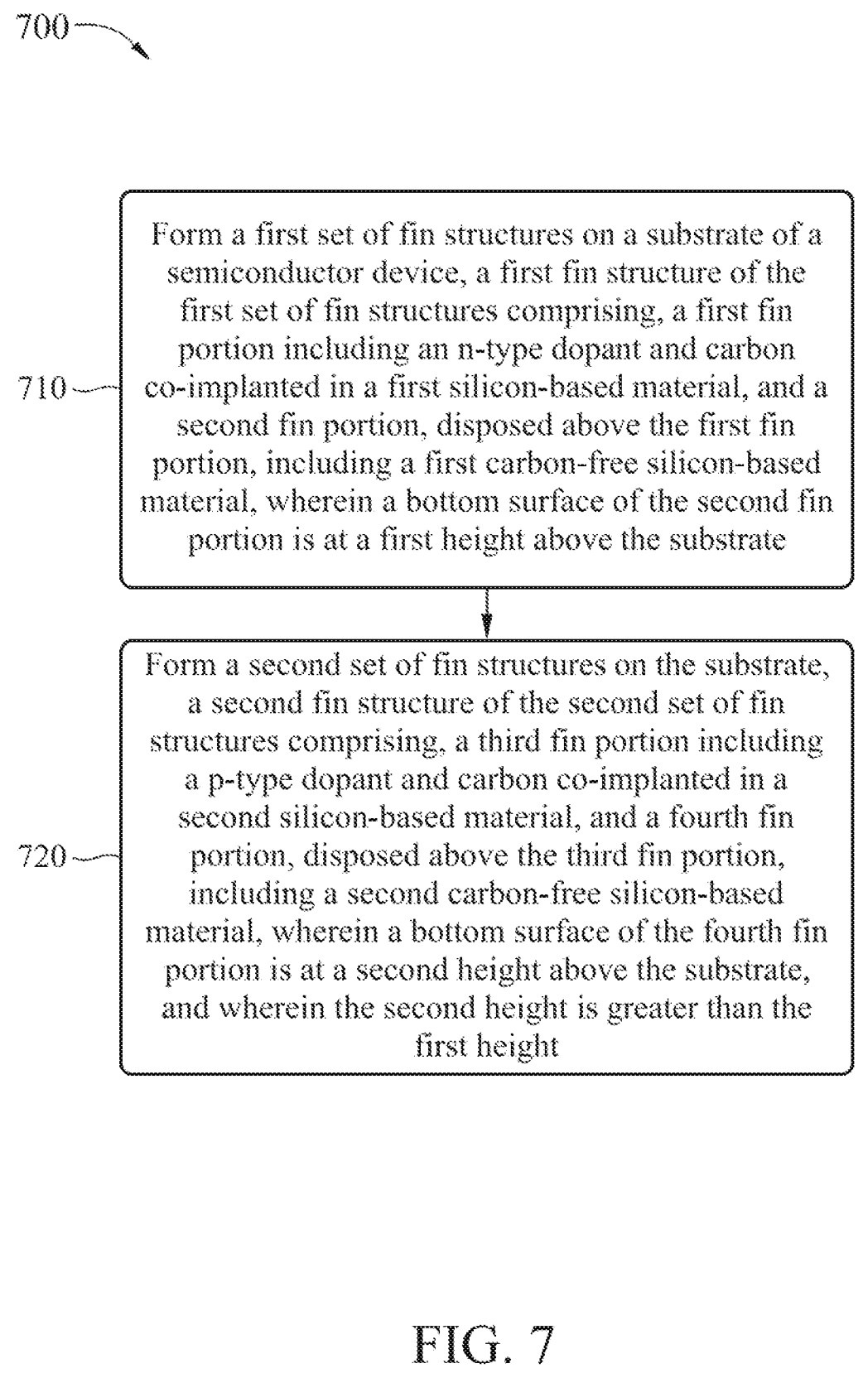

710 — Form a first set of fin structures on a substrate of a semiconductor device, a first fin structure of the first set of fin structures comprising, a first fin portion including an n-type dopant and carbon co-implanted in a first silicon-based material, and a second fin portion, disposed above the first fin portion, including a first carbon-free silicon-based material, wherein a bottom surface of the second fin portion is at a first height above the substrate 720 — Form a second set of fin structures on the substrate, a second fin structure of the second set of fin structures comprising, a third fin portion including a p-type dopant and carbon co-implanted in a second silicon-based material, and a fourth fin portion, disposed above the third fin portion, including a second carbon-free silicon-based material, wherein a bottom surface of the fourth fin portion is at a second height above the substrate, and wherein the second height is greater than the first height

FIG. 7

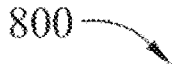
800
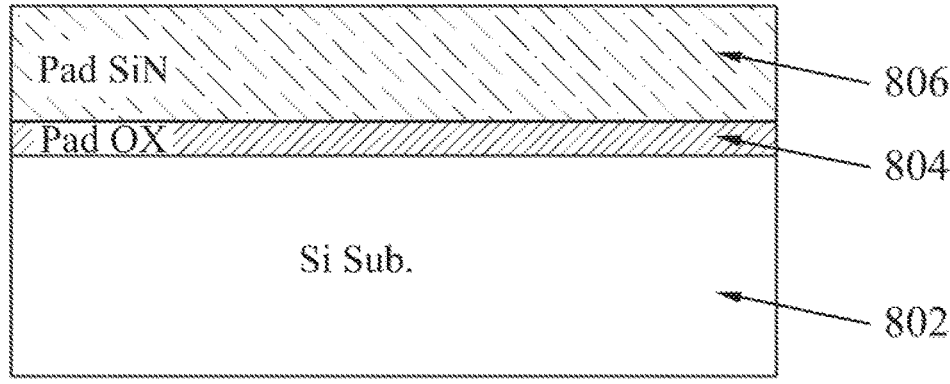
FIG. 8A
800
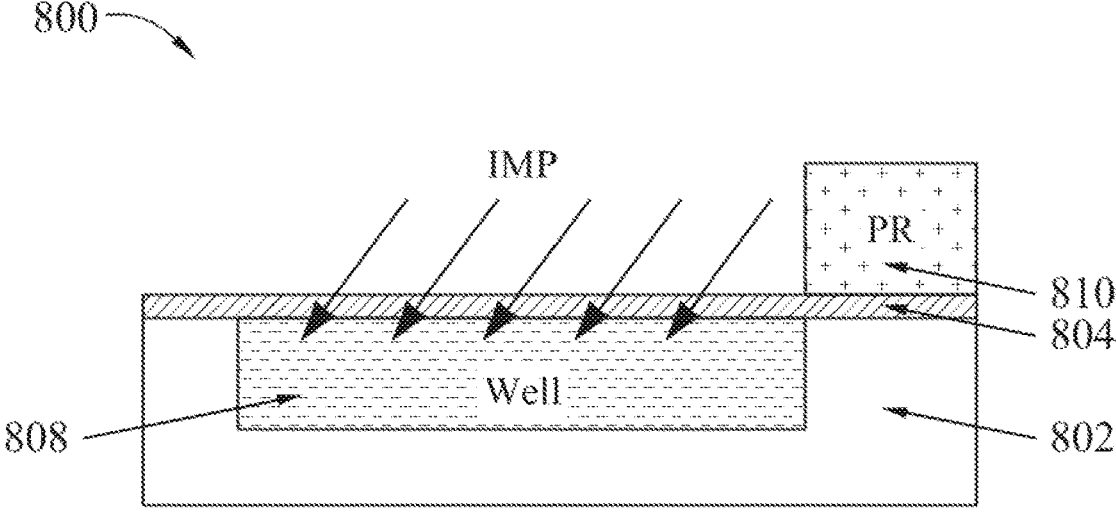
FIG. 8B

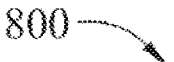
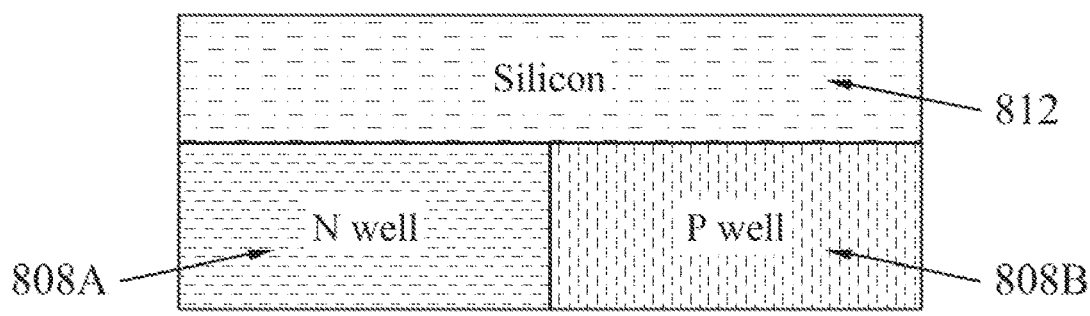
FIG. 8C
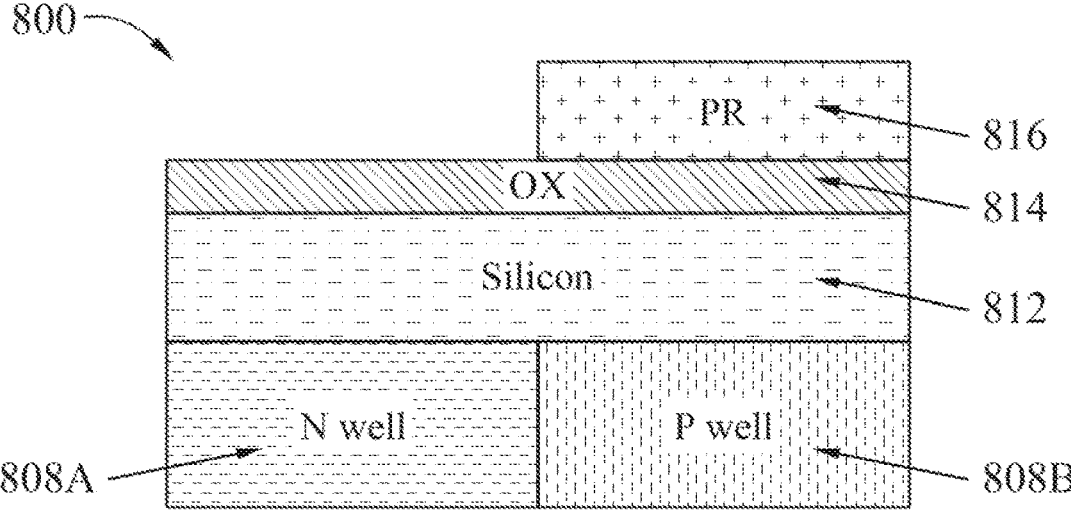
FIG. 8D

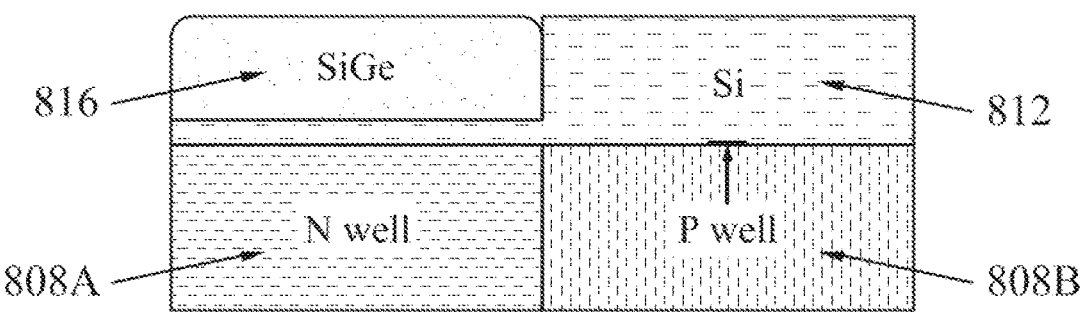
FIG. 8G
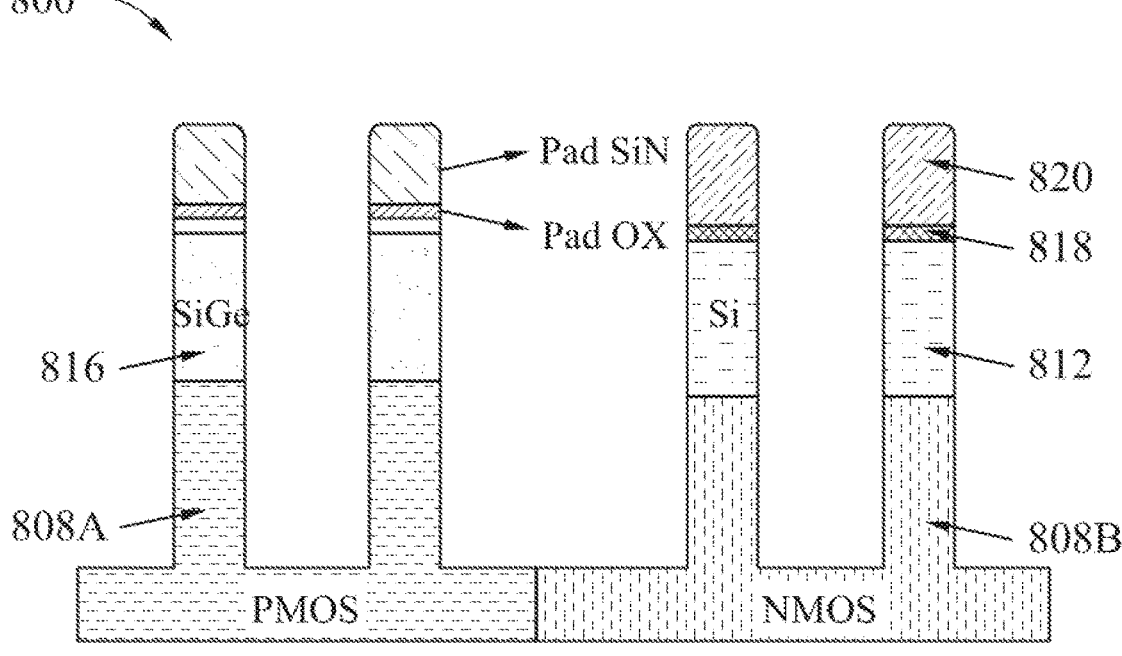
FIG. 8H

800

800

FIN STRUCTURE WITH REDUCED DEFECTS AND MANUFACTURING METHOD THEREOF

CROSS-REFERENCE TO RELATED APPLICATION

This Patent Application claims priority to Provisional Patent Application No. 63/201,653, filed on May 7, 2021, and entitled "FIN STRUCTURE WITH REDUCED DEFECTS AND MANUFACTURING METHOD THEREOF." The disclosure of the prior Application is considered part of and is incorporated by reference into this Patent Application.

BACKGROUND

Fin-based field effect transistor (FinFET) devices are three-dimensional structures that have a conductive channel region that includes a fin of semiconductor material that rises above a substrate as a three-dimensional structure. A gate structure, configured to control a flow of charge carriers within the conductive channel region, wraps around the fin of semiconductor material. For example, in a gate-all-around (GAA) FinFET structure, the gate structure wraps around all sides of a fin of semiconductor material, thereby forming conductive channel regions on all sides of the fin. A commonly used type of FET is a metal-oxide-semiconductor field-effect transistor (MOSFET). A MOSFET can be used, for example, as a switch for an electrical signal (e.g., a radio frequency (RF) switch) or as an amplifier for an electrical signal (e.g., a low-noise amplifier (LNA)), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2J are diagrams of an example implementation described herein.

FIGS. 5-7 are flowcharts of example processes relating to forming a semiconductor device described herein.

DETAILED DESCRIPTION

Figure 1:
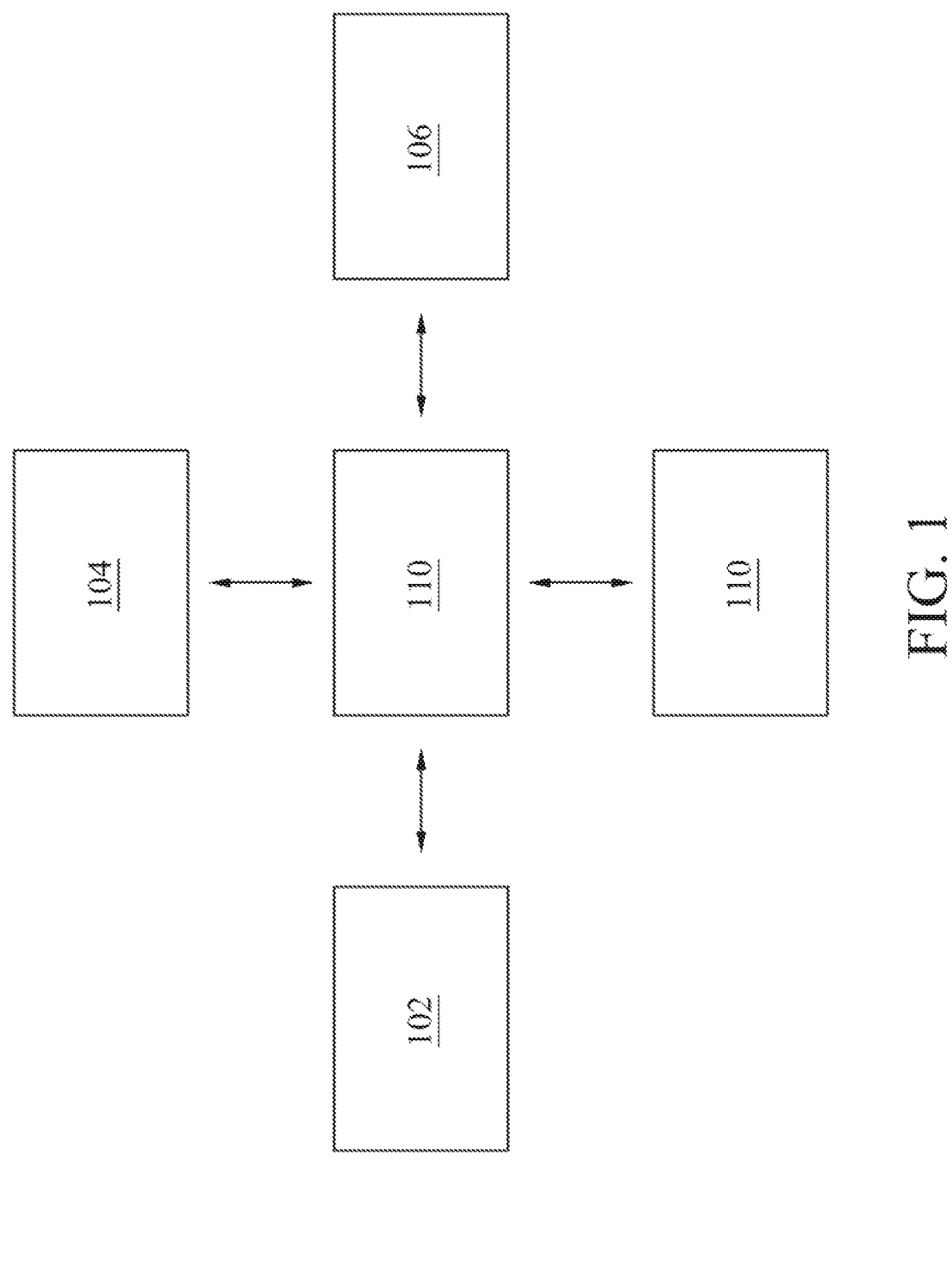
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With demand to further decrease sizes of electronic devices having FinFET devices, manufacturers have attempted to shrink widths of fins of the FinFET devices. However, at a fin width become smaller, such as approximately 10 nanometers or less, the FinFET device has increased source/drain electron tunneling, which increases an off current of the FinFET device. Additionally, at smaller fin widths (e.g., about 3 nanometers of fin width), a FinFET device may begin to fail and have a short channel effect. In some electronic devices, co-implanting carbon with a dopant into a well may be used to support a decreased height of a source/drain and/or to improve dopant activation for the electronic devices.

In some implementations described herein, a fin structure includes an epitaxial material (e.g., silicon germanium) formed on a well having carbon and a dopant co-implanted without a diffusion region (e.g., a region in which carbon has diffused into the epitaxial material) between the epitaxial material and the doped portion of the substrate, or with a diffusion region disposed below a top surface of surrounding isolation structures. In this way, the fin structure may improve source/drain electron tunneling and/or may improve a short channel effect. Further, the fin structure may have reduced cluster damage defects that may otherwise cause uneven layers in materials disposed above the fin structure. Based on these features, a semiconductor device that includes a fin structure described herein may have a reduced likelihood of failure, which may reduce consumption of manufacturing resources and/or consumption of materials to manufacture a number of functioning semiconductor devices.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool, an ion implantation tool, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 108 is a semiconductor processing tool that is capable of implanting ions into a substrate such as a semiconductor wafer. The ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

FIGS. 2A-2J are diagrams of an example semiconductor device 200 described herein. Semiconductor device 200 may be manufactured using an example process as shown in FIGS. 2A-2J. The example process may include one or more operations (e.g., lithography operations, operations performed on different portions of an electronic device that includes the semiconductor device 200) and/or operations shown in the example process may be performed in a different order from the order shown in FIGS. 2A-2J. The semiconductor device 200 may include one or more additional devices, structures, and/or layers not shown in FIGS. 2A-2J. For example, the semiconductor device 200 may include additional layers and/or dies formed on layers above and/or below the portion of the semiconductor device 200 shown in FIGS. 2A-2J. Additionally, or alternatively, one or more additional semiconductor structures and/or semiconductor devices may be formed in a same layer of an electronic device that includes the semiconductor device, with a lateral displacement, as the semiconductor device 200 shown in FIGS. 2A-2J. The semiconductor device 200 may be used in a FinFET structure having a narrow critical dimension (e.g., a lateral dimension as shown in FIGS. 2A-2J), such as an advanced FinFET structure.

As shown in FIG. 2A, the semiconductor device 200 includes a substrate 202. The substrate 202 may include a semiconductor die substrate, a semiconductor wafer, or another type of substrate in and/or on which semiconductor devices may be formed. In some implementations, the substrate 202 is formed of silicon (Si), a material including silicon, a III-V compound semiconductor material such as gallium arsenide (GaAs), a silicon on insulator (SOI), or another type of semiconductor material.

As shown in FIG. 2B, the semiconductor device 200 may include a portion 204 and a portion 206 of the semiconductor device. The portion 204 may be configured to have a first doping type to form a first type of well and the portion 206 may be configured to have a second doping type to form a second type of well. For example, the portion 204 may be configured to be n-doped and to form an n-well and the portion 206 may be configured to be p-doped and to form a p-well.

A photoresist 208 may be formed on a top surface of the portion 204 and not on the portion 206. For example, a semiconductor processing tool (e.g., the deposition tool 102) may deposit the photoresist 208 using a spin coating operation and an exposure operation to form the photoresist 208 on the portion 204 and not on the portion 206. With the photoresist 208 on the portion 204 and not on the portion 206, a semiconductor processing tool (e.g., the ion implantation tool 108) may co-implant a dopant (e.g., a p-type dopant) and carbon into a portion 210 of the substrate 202. The dopant may include boron, aluminum, gallium, or indium, among other p-type dopants. A process of co-implanting may include a single step implantation operation or may include a multi-step implantation operation. For example, the semiconductor processing tool may implant the dopant and carbon in a single operation or may deposit the dopant and the carbon in separate (e.g., sequential) operations. After co-implanting the dopant and the carbon into the portion 210 of the substrate 202, the photoresist 208 may be removed via a semiconductor processing tool (e.g., the etching tool 104).

As shown in FIG. 2C, a photoresist 212 may be formed on a top surface of the portion 206 and not on the portion 204. For example, a semiconductor processing tool (e.g., the deposition tool 102) may deposit the photoresist 212 using a spin coating operation and an exposure operation to form the photoresist 212 on the portion 206 and not on the portion 204. With the photoresist 212 on the portion 206 and not on the portion 204, a semiconductor processing tool (e.g., the ion implantation tool 108) may co-implant a dopant (e.g., an n-type dopant) and carbon into a portion 214 of the substrate 202. The dopant may include phosphorus, arsenic, antimony, bismuth, or lithium, among other n-type dopants.

After co-implanting the dopant and the carbon into the portion 214 of the substrate 202, the photoresist 212 may be removed via a semiconductor processing tool (e.g., the etching tool 104). In some implementations, a semiconductor processing tool may clean the semiconductor device 200 using, for example, hydrogen fluoride (e.g., hydrofluoric acid) and/or nitrogen trifluoride with ammonia. In some implementations, a semiconductor processing tool may bake the semiconductor device to provide thermal annealing (e.g., an extra thermal anneal) to remove oxygen and/or fluoride molecules from a top surface of the semiconductor device and to induce a surface pileup of dopants.

Figure 2D:
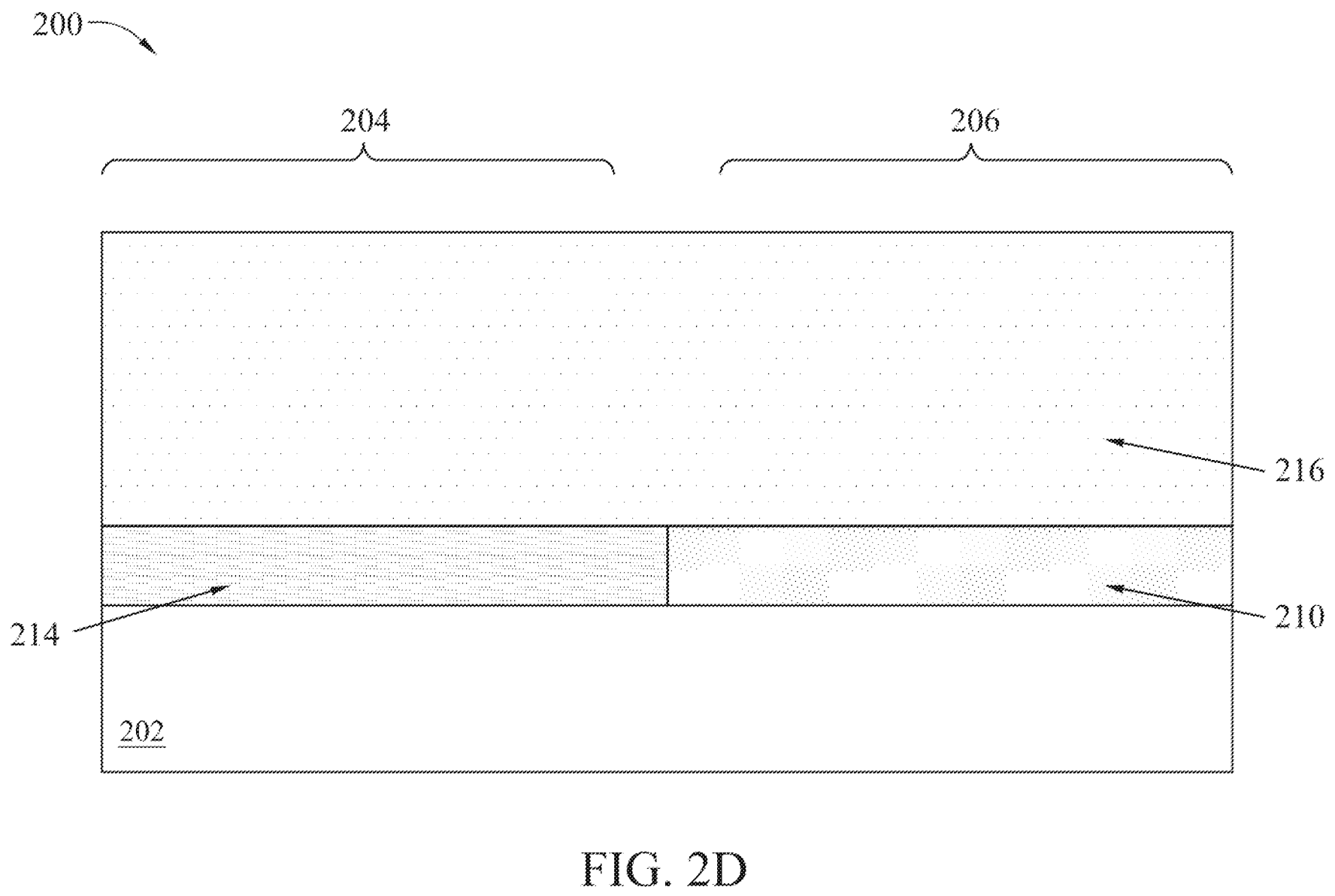

As shown in FIG. 2D, a silicon-based layer 216 may be formed on a top surface of the portion 214 and on a top surface of the portion 210. For example, a semiconductor processing tool (e.g., the deposition tool 102) may deposit the silicon-based layer 216 on the top surface of the portion 214 and on the top surface of the portion 210 using chemical vapor deposition or physical vapor deposition, among other examples. The semiconductor processing tool may deposit the silicon-based layer 216 by providing silane, dichlorosilane and/or hydrogen ($H_2$) to the top surface of the semiconductor device 200. The silicon-based layer 216 may be deposited with a temperature in a range of approximately 700 degrees Celsius to approximately 800 degrees Celsius. In some implementations, the silicon-based layer may have a thickness (e.g., a height relative to the top surfaces of the portions 210 and/or 214) in a range of approximately 30 nanometers to approximately 80 nanometers. The silicon-based layer 216 may include a pure silicon material (e.g., a silicon-based material having a concentration of silicon that is greater than or equal to 99%).

In some implementations, a semiconductor processing tool (e.g., the planarization tool 106) may polish and/or planarize the silicon-based layer 216 to form a generally planar top surface of the silicon-based layer 216. In this way, the top surface of the silicon-based layer 216 may be suitable for depositing additional material of the semiconductor device 200 and/or may improve uniformity of a subsequent etching process.

Figure 2E:
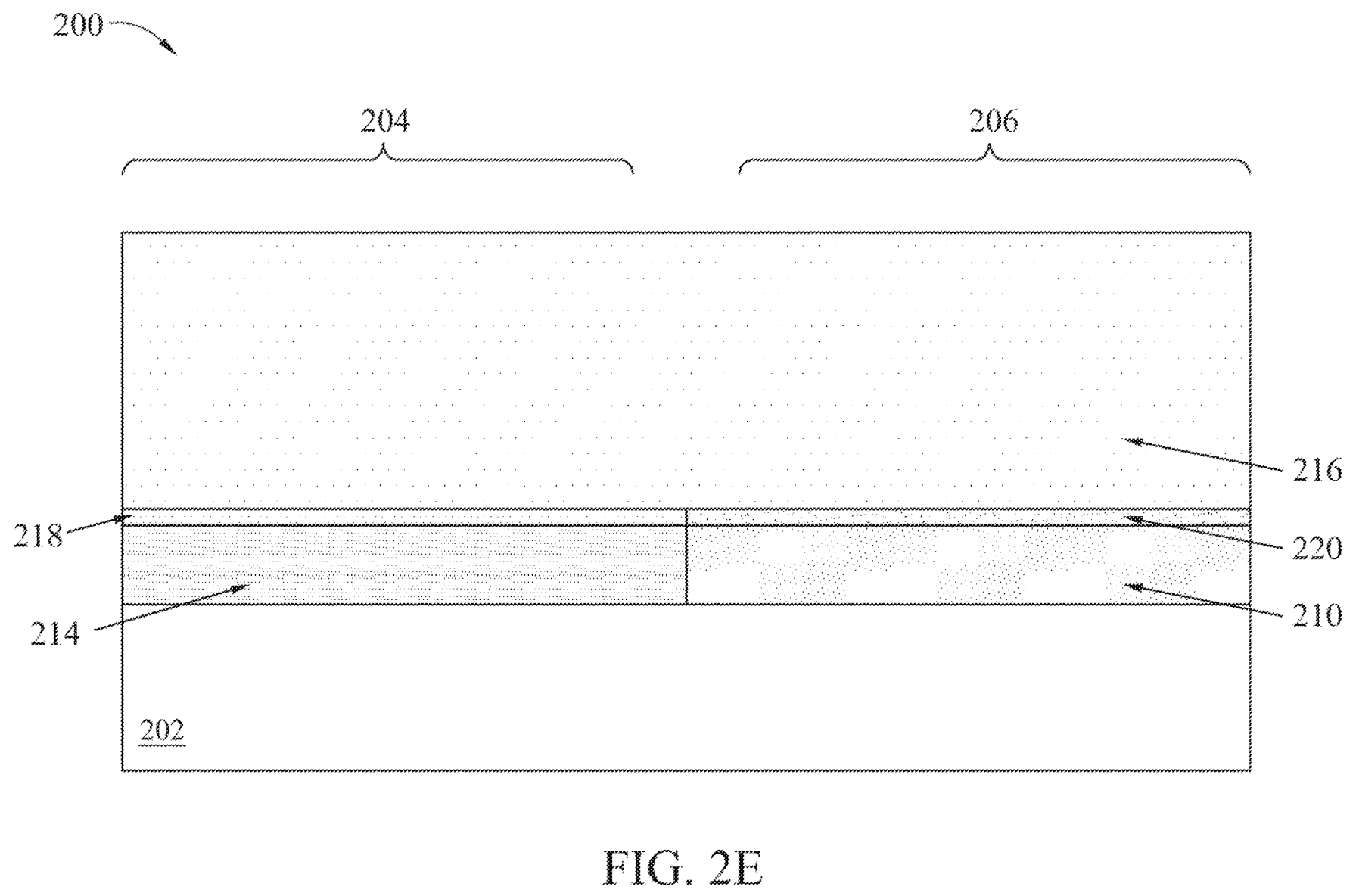

As shown in FIG. 2E, a diffusion region 218 may form between the portion 214 and the silicon-based layer 216 based on the silicon-based layer 216 reacting with carbon in the portion 214. In some implementations, the silicon-based layer 216 reacts with the carbon to form a diffusion region 218 on the portion 214 of the substrate 202 and/or the silicon-based layer 216 reacts with the carbon to form a diffusion region 218 on the portion 214 of the substrate 202 based on applying heat. For example, a semiconductor processing tool may bake the semiconductor device (e.g., at a temperature in a range of approximately 750 degrees Celsius to approximately 950 degrees Celsius), which may induce the carbon to diffuse into the diffusion region 218.

Additionally, or alternatively, a diffusion region 220 may form between the portion 210 and the silicon-based layer 216 based on the silicon-based layer 216 reacting with carbon in the portion 210. In some implementations, the silicon-based layer 216 reacts with the carbon to form a diffusion region 220 on the portion 210 of the substrate 202 and/or the silicon-based layer 216 reacts with the carbon to form a diffusion region 220 on the portion 210 of the substrate 202 based on applying heat. For example, a semiconductor processing tool may bake the semiconductor device (e.g., at a temperature in a range of approximately 750 degrees Celsius to approximately 950 degrees Celsius), which may induce the carbon to diffuse into the diffusion region 220.

In some implementations, diffusion may be localized. For example, the diffusion region 218 may be formed and the diffusion region 220 may not be formed (e.g., the semiconductor device may have the diffusion region 218 and may not have the diffusion region 220) or vice versa (e.g., the semiconductor device may have the diffusion region 220 and may not have the diffusion region 218). This may be based on a diffusion rate of carbon within the portion 214 (e.g., based at least in part on diffusion of carbon away from a dopant of the portion 214), a diffusion rate of carbon within the portion 210 (e.g., based at least in part on diffusion of carbon away from a dopant of the portion 210) and/or a temperature of baking the semiconductor device 200, among other examples. In some implementations, the diffusion region 218 may be formed and the diffusion region 220 may not be formed based on applying localized heat. For example, one or more semiconductor processing tools may apply laser-based heat to the diffusion region 218 and not to the diffusion region 220. In some implementations, the diffusion may form the diffusion region 218 and the diffusion region 220 with a gap (e.g., without carbon diffused into the silicon-based layer) above a junction between the portion 214 and the portion 210, respectively.

The silicon-based layer 216 may include carbon-free silicon-based material (e.g., material having a concentration of carbon that is less than 1% carbon) such that an interface between the silicon-based layer 216 and the diffusion region 218 and/or the diffusion region 220 is based on carbon content.

Figure 2F:
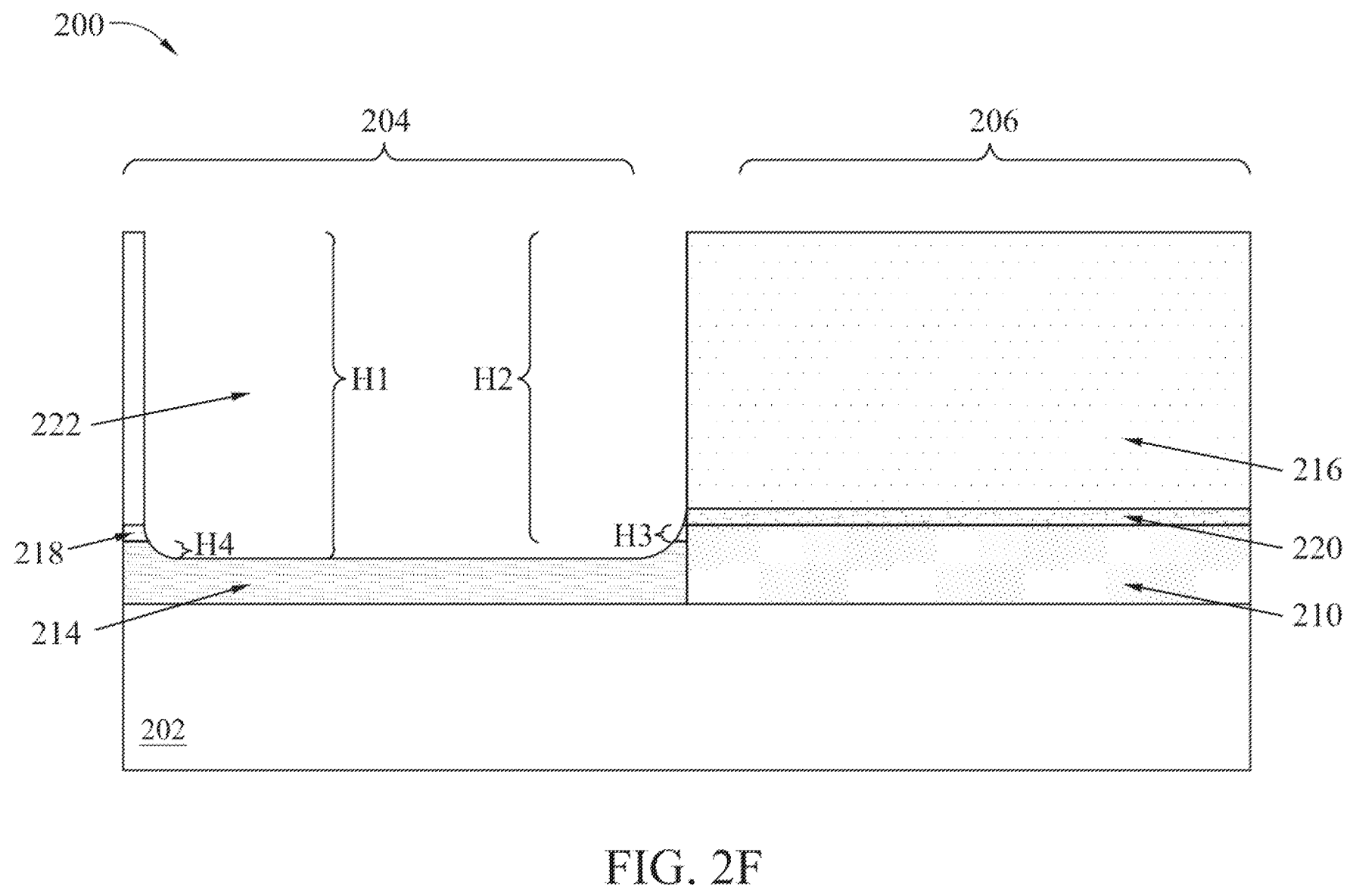

As shown in FIG. 2F, a recessed portion 222 may be formed in the portion 204. For example, a semiconductor processing tool (e.g., the etching tool 104) may etch through at least a portion (e.g., a full height and at least a portion of a width) of the silicon-based layer 216 and the diffusion region 218 from the portion 204. In some implementations, the semiconductor processing tool may be configured to etch until reaching the diffusion region 218 or the portion 214 and then to etch for an amount of time after reaching the diffusion region 218 or the portion 214.

In some implementations, the recessed portion 222 has a height H1, relative to a top surface of the substrate (e.g., a top surface of the portion 214) and a top surface of the silicon-based layer 216 in the portion 206 (e.g., a distance between the top surface of the portion 214 and the top surface of the silicon-based layer 216 in the portion 206), in a range of approximately 40 nanometers to approximately 80 nanometers. In some implementations, the height H1 is greater than or equal to a height H2 of a sum of the silicon-based layer 216 and the diffusion region 218. The height H2 may be in a range of approximately 30 nanometers to approximately 80 nanometers. For example, the silicon-based layer 216 may have a height in a range of approximately 30 nanometers to approximately 80 nanometers, and the diffusion region 218 may have a height H3 in a range of approximately 5 nanometers to approximately 20 nanometers and/or in a range of approximately 12% to approximately 25% of a height of the silicon-based layer 216. The height H3 may be based on a baking and/or annealing temperature, a baking and/or annealing time, concentrations of carbon in the portion 210 and the portion 214, and/or material of the silicon-based layer 216.

In some implementations, the recessed portion 222 may partially extend into the portion 214 of the substrate 202. For example, the recessed portion 222 may extend into the portion 214 of the substrate 202 with a height H4 relative to a top surface of the portion 214. For example, the height H4 may be a vertical distance between a top surface of the portion 214 within the recessed portion 222 and a top surface of the portion 214 outside of the recessed portion 222. In some implementations, the height H4 is in a range of approximately 5 nanometers to approximately 10 nanometers. In some implementations, the height H1 is in a range of approximately 120% to approximately 140% of the height H2. In this way, the recessed portion 222 extends into the portion 214 far enough to provide a sufficiently wide channel to the portion 214 that does not have the diffusion region 218 on the upper surface of the portion 214. For example, based on an etching process producing a curved (e.g., concave up) upper surface of the portion 214, the upper surface of the portion 214 at a middle of the recessed portion 222 may have a height H1 and the upper surface of the portion 214 at edges of the upper surface of the portion 214 may have a height that is less than H1. Based on the height H1 extending into the portion 214 by an amount in the range of approximately 5 nanometers to approximately 10 nanometers and or in a range of approximately 5% to approximately 20% of the height H2, the recessed portion 222 may extend into the portion 214 far enough away from the middle of the recessed portion 222 to form fin structures that do not have the diffusion region above the upper surface of the portion 214. As is shown in subsequent operations, the sufficiently wide channel may be used to form fin structures having a type of silicon-based material that is different from the silicon-based layer 216.

Figure 2G:
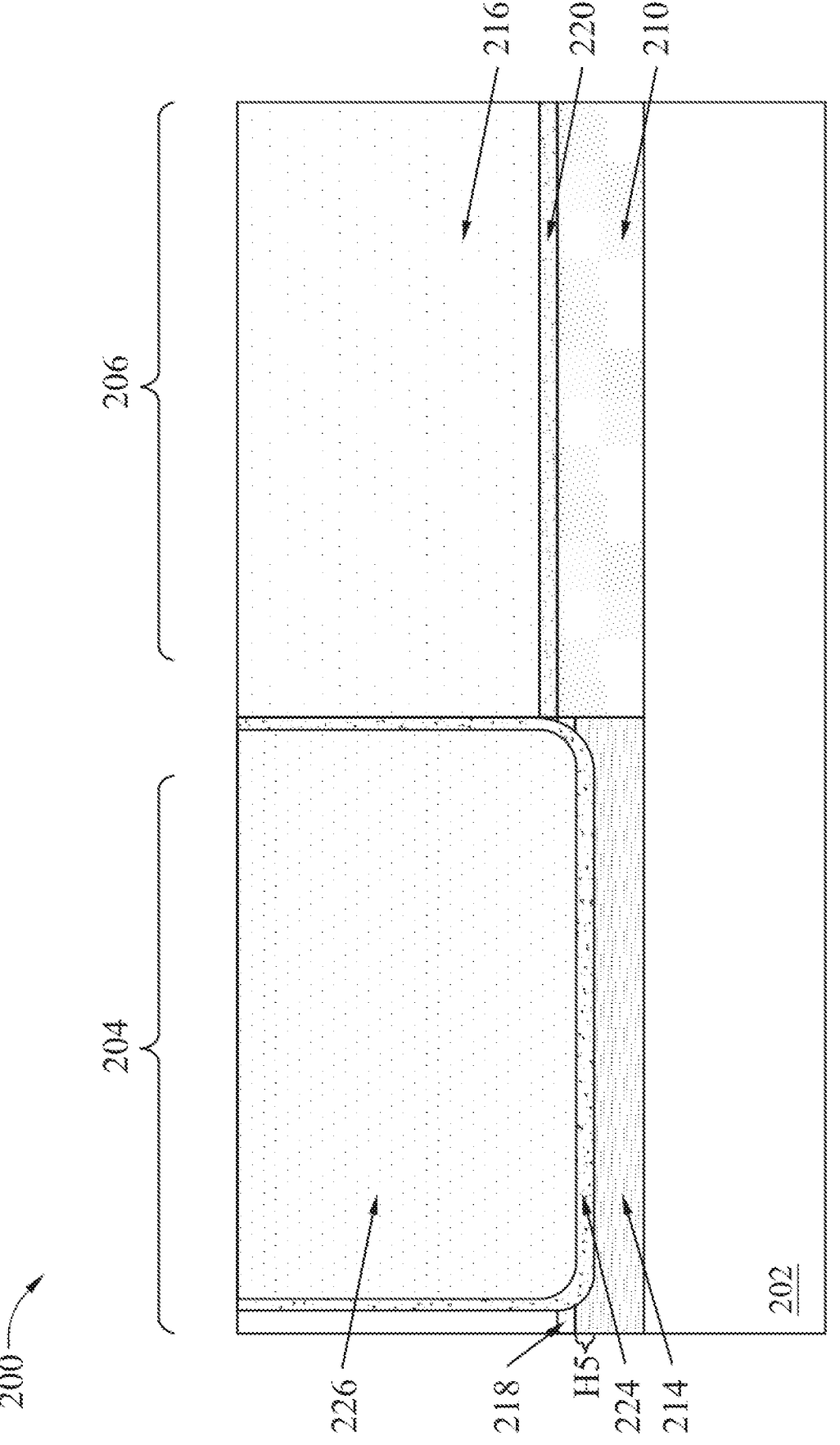

As shown in FIG. 2G, a seed layer 224 and/or a silicon-based layer 226 may be formed within the recessed portion 222 and on a top surface of the portion 214. For example, a semiconductor processing tool (e.g., the deposition tool 102) may deposit the silicon-based layer 226 within the recessed portion 222 and on the top surface of the portion 214 using chemical vapor deposition or physical vapor deposition, among other examples. The In some implementations, the silicon-based layer 226 may include germanium. For example, the silicon-based layer 226 may have a concentration of germanium in a range of approximately 10% to approximately 35%. In some implementations, the seed layer 224 may be omitted or the silicon-based layer 226 may include the seed layer 224. The seed layer 224 and/or the silicon-based layer 226 may include carbon-free silicon-based material (e.g., material having a concentration of carbon that is less than 1% carbon).

In some implementations, the semiconductor processing tool may deposit the seed layer 224 into the recessed portion 222 before depositing the silicon-based layer 226. The seed layer 224 may include pure silicon (e.g., having a concentration of silicon that is greater than or equal to 99% silicon), lightly doped silicon, or a gradient silicon, among other examples. The seed layer 224 may include silicon having a concentration of silicon that is in a range of approximately 1% to approximately 10%. The seed layer 224 may have a concentration of silicon that is greater than a concentration of silicon in the silicon-based layer 226 (e.g., the silicon-based layer 226 may have a concentration of germanium that is higher than a concentration of germanium in the seed layer 224). In this way, the silicon-based layer 226 may have a reduced contact resistance between the silicon-based layer 226 and the portion 214 that may have otherwise been caused by a transition between the silicon-based layer 226 and the portion 214.

In some implementations, a semiconductor processing tool (e.g., the planarization tool 106) may polish and/or planarize the top surfaces of the silicon-based layer 226 and the silicon-based layer 216 to form a generally planar top surface of the semiconductor device 200. In this way, the top surfaces of the silicon-based layer 226 and the silicon-based layer 216 may be suitable for depositing additional material of the semiconductor device 200 and/or may improve uniformity of a subsequent etching process.

Figure 2H:

As shown in FIG. 2H, a set 228 of fin structures and a set 230 of fin structures may be formed within the semiconductor device 200. For example, a semiconductor processing tool (e.g., the etching tool 104) may etch portions of the silicon-based layer 226, the seed layer 224, the portion 214, and/or the substrate 202 at the portion 204 to form the set 228 of fin structures (e.g., p-type fin structures). The set 228 of fin structures include a seed layer 224 and/or an upper portion 226 (e.g., formed from the silicon-based layer 226 and/or being carbon-free). The semiconductor processing tool may also etch portions of the silicon-based layer 216, the diffusion region 220, the portion 210, and/or the substrate 202 at the portion 206 to form the set 230 of fin structures (e.g., n-type fin structures). The set 230 of fin structures include a diffusion region 220 and/or an upper portion 216 (e.g., formed from the silicon-based layer 216 and/or being carbon-free). The set 228 of fin structures may include silicon germanium fin structures of a P-type metal-oxide-semiconductor (MOS) structure and the set 230 of fin structures may include silicon fin structures of an N-type MOS structure.

In some implementations, a semiconductor processing tool provides a hardmask in a pattern on a top surface of the silicon-based layer 216 and the silicon-based layer 226 before performing an etching operation. For example, the hardmask may be patterned to be disposed on top surfaces of the set 228 of fin structures and the set 230 of fin structures before etching the portions of the silicon-based layer 226, the seed layer 224, the portion 214, the substrate 202, the silicon-based layer 216, the diffusion region 220, and/or the portion 210.

Figure 2I:
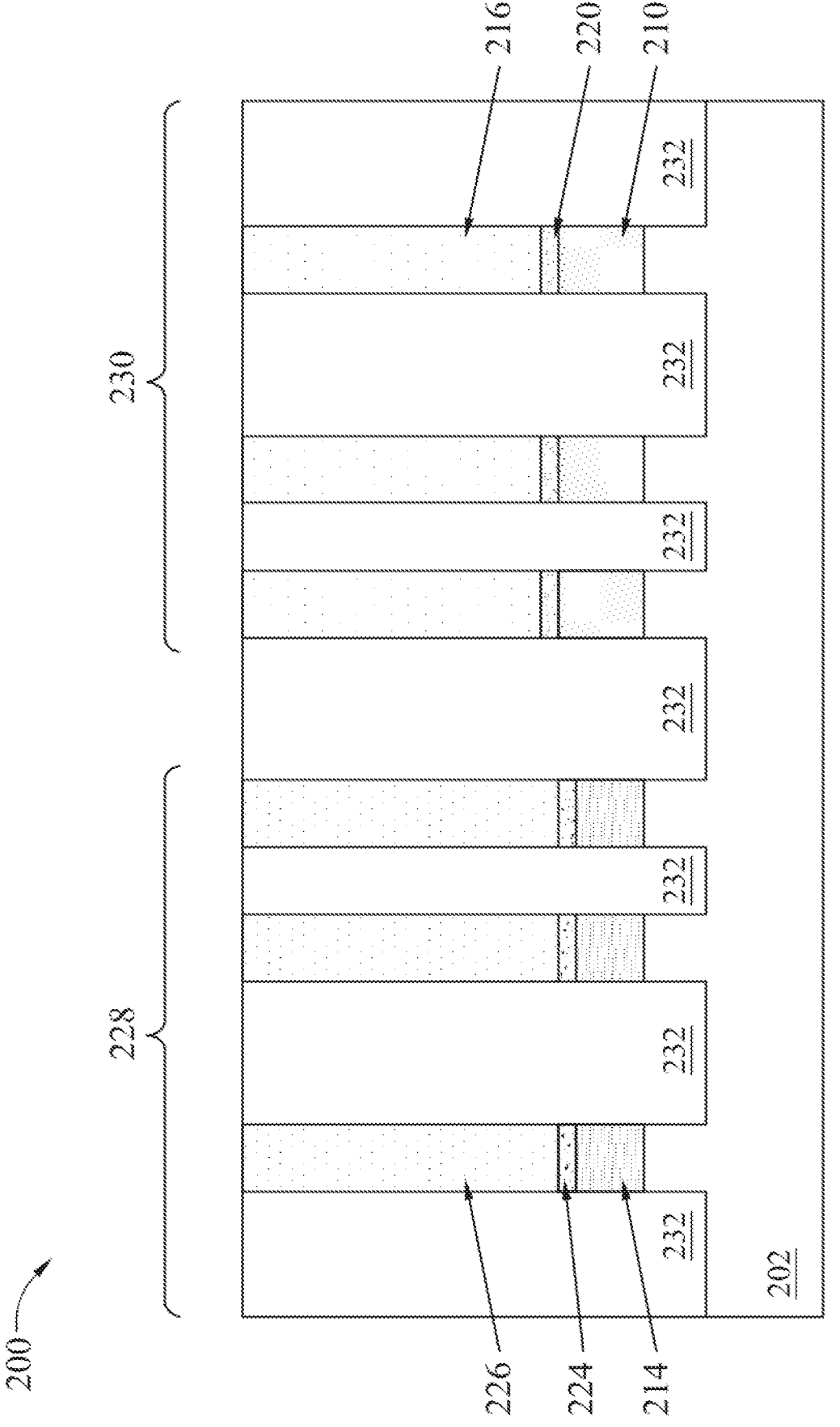

As shown in FIG. 2I, material for a set of isolation structures 232 may be formed between the set 228 of fin structures and between the set 230 of fin structures. For example, a semiconductor processing tool (e.g., the deposition tool 102) may deposit the material for the set of isolation structures 232 using chemical vapor deposition or physical vapor deposition, among other examples. In some implementations, the material for a set of isolation structures 232 includes silicon oxide or silicon germanium.

In some implementations, a semiconductor processing tool (e.g., the planarization tool 106) may polish and/or planarize the semiconductor device 200 to form a generally planar top surfaces of the set 228 of fin structures, the set 230 of fin structures, and/or the material for the set of isolation structures 232. In this way, the top surfaces of the set 228 of fin structures, the set 230 of fin structures, and/or the material for the set of isolation structures 232 may be suitable for depositing additional material of the semiconductor device 200 and/or may improve uniformity of a subsequent etching process.

Figure 2J:
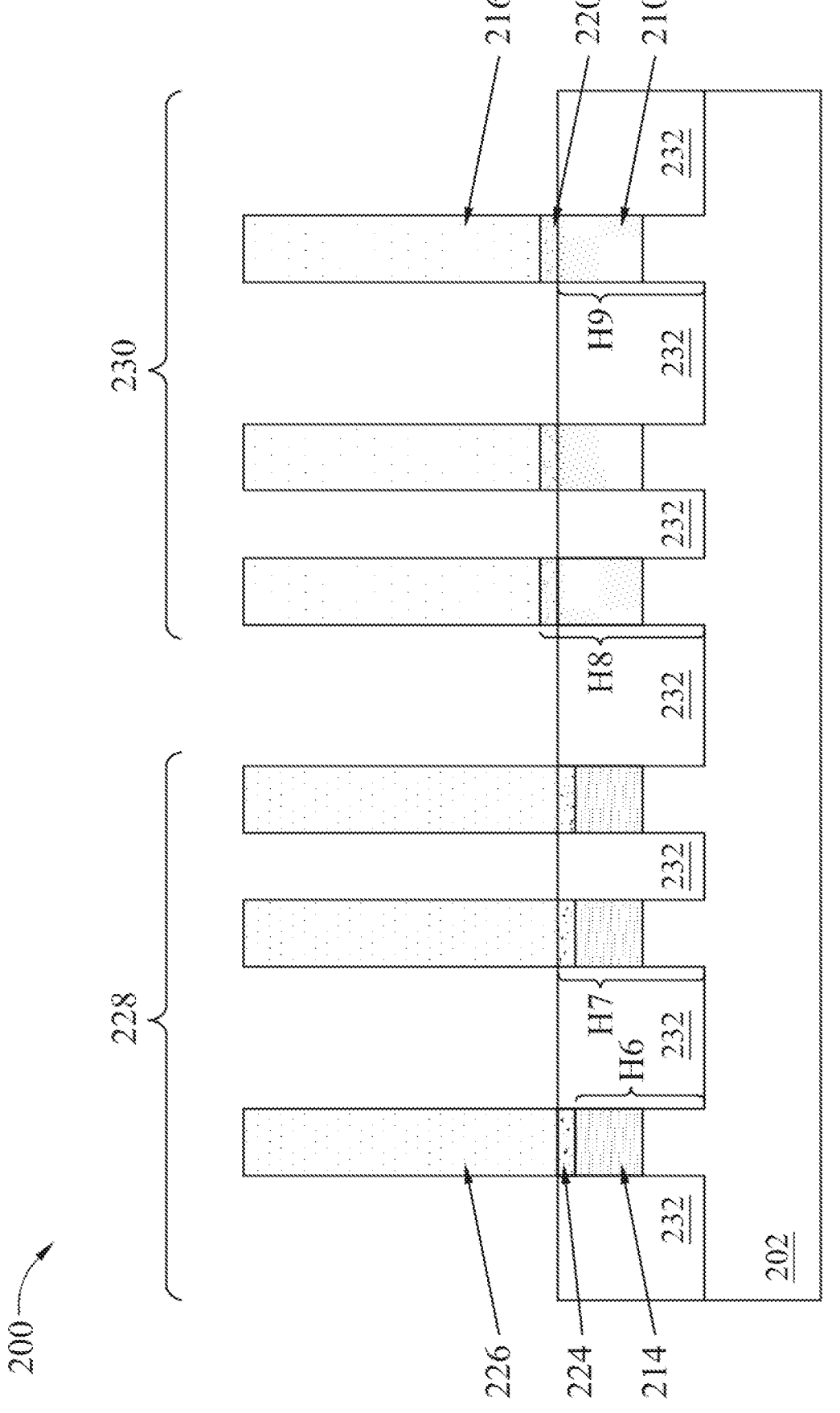

As shown in FIG. 2J, the material for the set of isolation structures 232 may be etched to form the set of isolation structures 232 having top surfaces that are above a bottom surface of a fin portion that includes a carbon-free silicon material (e.g., formed from the silicon-based layer 226) and/or a fin portion (e.g., formed from the seed layer 224). For example, a semiconductor processing tool (e.g., the etching tool 104) may etch the material of the set of isolation structures 232 such that a height H6 of a bottom surface of the fin portion that includes the carbon-free silicon material is less than or equal to a height H7 of the top surface of the set of isolation structures 232. In this way, the set 228 of fin structures have a reduced likelihood of causing a clustering defect, which may have otherwise been caused by a diffusion region extending above the top surface of the set of isolation structures 232.

In some implementations, a bottom surface of a fin portion, of a fin structure in the set 230 of fin structures, is at a height H8 relative to a top surface of the substrate 202. The height H8 may be greater than or equal to the height H7 such that the fin portion (e.g., including carbon-free silicon-based material) is above the set of isolation structures 232.

As described in connection with FIGS. 2A-2J, the semiconductor device 200 may include the set 228 of fin structures extending from the substrate 202 with a fin structure (e.g., each fin structure) of the set 228 of fin structures including a first fin portion 214 that includes a dopant and carbon co-implanted in a silicon-based material. The fin structure of the set 228 of fin structures also includes a second fin portion (e.g., including the seed layer 224 and/or the silicon-based layer 226), disposed above the first fin portion 214, including a carbon-free silicon-based material, with a bottom surface of the second fin portion 224, 226 being at a height H6 above the substrate 202.

A set of isolation structures 232 is disposed between fin structures of the set 228 of fin structures, where a top surface of the set of isolation structures 232 is at a height H7 above the substrate 202 and the height H6 is less than or equal to the height H7. In this way, the set 228 of fin structures have a reduced likelihood of causing a clustering defect, which may have otherwise been caused by a diffusion region extending above the top surface of the set of isolation structures 232.

The semiconductor device 200 may also include the set 230 of fin structures extending from the substrate 202 with a fin structure of the set 230 of fin structures including a third fin portion 210 that includes an additional dopant and carbon co-implanted in the silicon-based material. The fin structure of the set 230 of fin structures includes a fourth fin portion 220, disposed above the third fin portion 210, that includes a diffusion region having carbon diffused into silicon. A top surface of the fourth fin portion 220 is at a height H8 above the substrate. A fifth fin portion 216, disposed above the fourth fin portion 220, that includes an additional carbon-free silicon-based portion.

An additional set of isolation structures 232 may be disposed between fin structures of the set 230 of fin structures and a top surface of the additional set 230 of set of isolation structures 232 is at a height H7 above the substrate 202. The height H8 is greater than or equal to the height H9. In some implementations, the height of the isolation structures 232 between the set 228 of fin structures is the same height as isolation structures 232 between the set 230 of fin structures. In this way, a same etching process may be used to form all of the isolation structures 232 (e.g., conserving manufacturing time and resources). Alternatively, the height of the isolation structures 232 between the set 228 of fin structures is different from the height of the isolation structures 232 between the set 230 of fin structures. In this way, the height H7 of the isolation structures between the set 228 of fin structures may be configured to be greater than the height H6.

As indicated above, FIGS. 2A-2J are provided as an example. Other examples may differ from what is described with regard to FIGS. 2A-2J. The number and arrangement of devices, layers, and/or materials shown in FIGS. 2A-2J are provided as an example. In practice, there may be additional devices, layers, and/or materials, fewer devices, layers, and/or materials, different devices, layers, and/or materials, or differently arranged devices, layers, and/or materials than those shown in FIGS. 2A-2J.

Figure 3A:
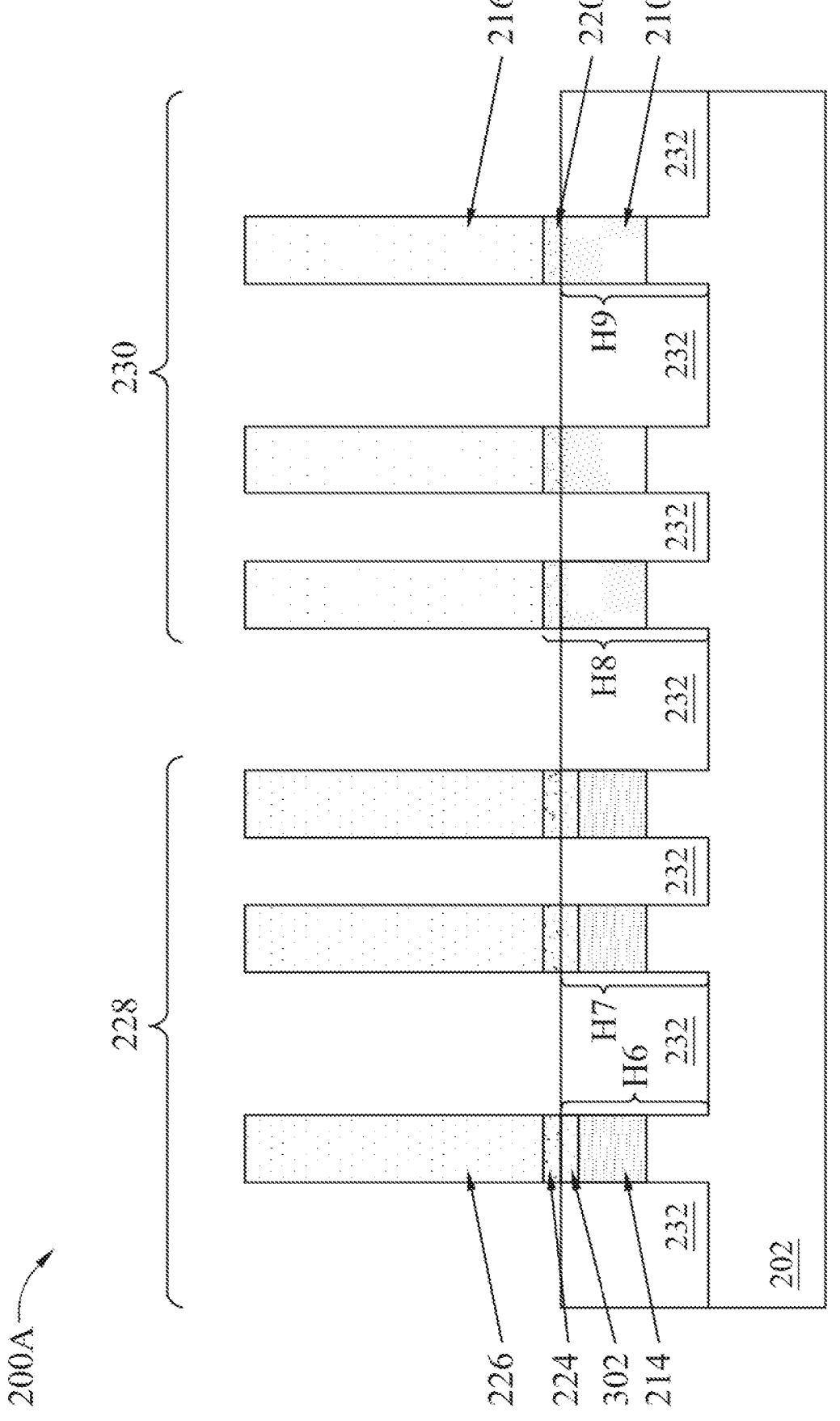
FIGS. 3A-3C are diagrams of example semiconductor devices described herein.
Figure 3B:
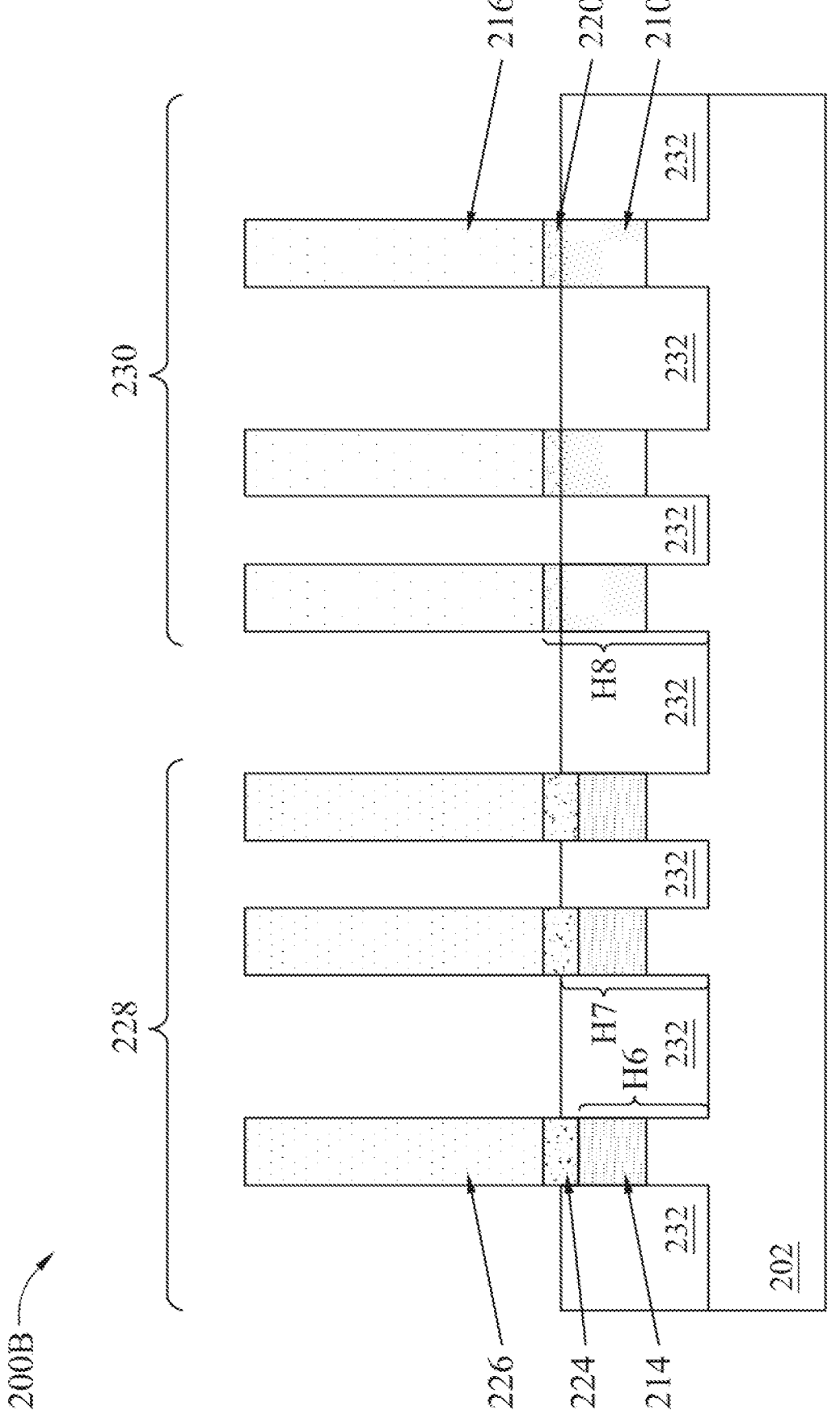
Figure 3C:
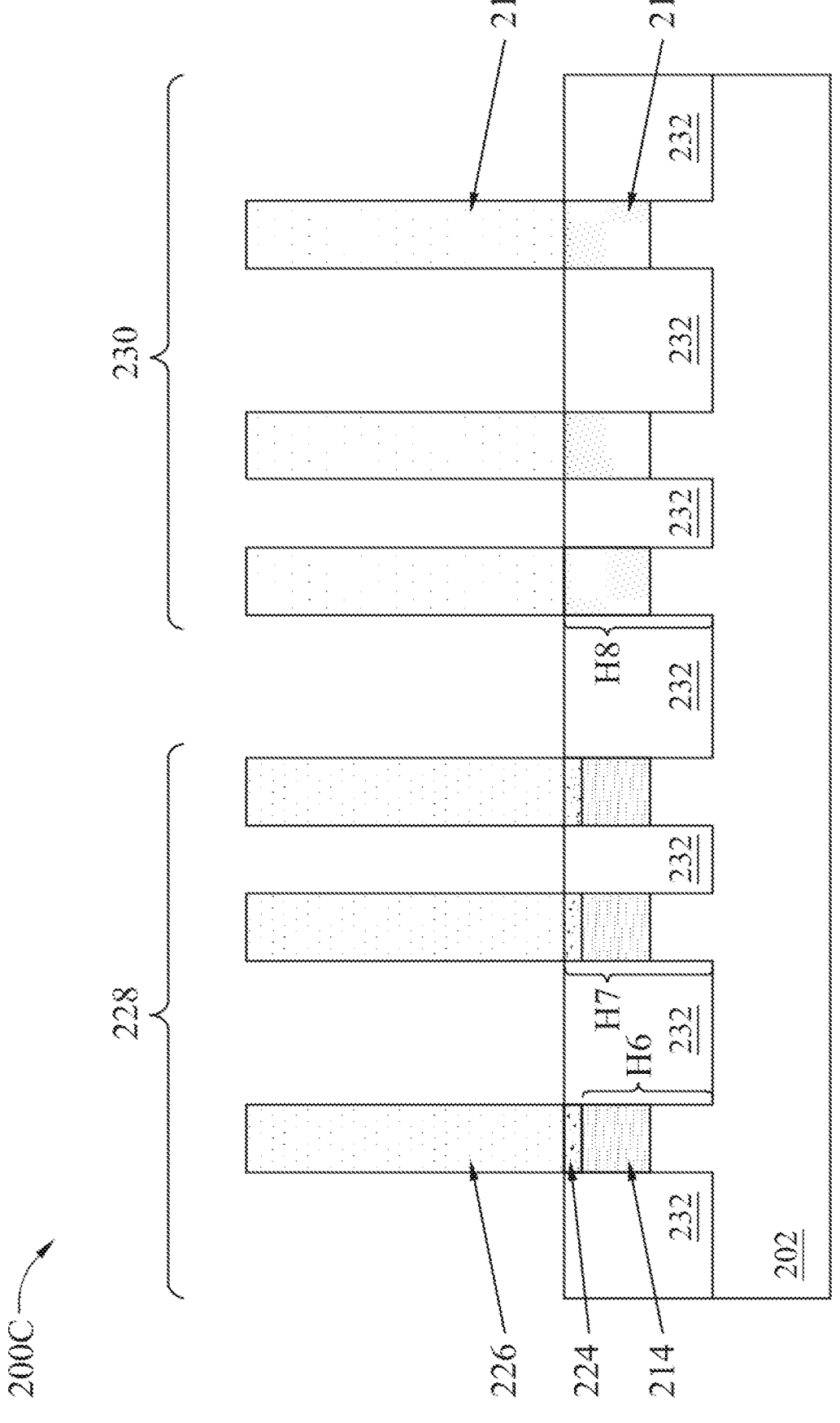

FIGS. 3A-3C are diagrams of example semiconductor devices 200A-200C described herein. The semiconductor devices 200A-200C may be formed using one or more operations described in connection with FIGS. 2A-2J. In some implementations, one or more operations described in connection with FIGS. 2A-2J may be omitted or modified to form the semiconductor devices 200A-200C.

As shown in FIG. 3A, semiconductor device 200A differs from the semiconductor device 200 based on including a fin portion 302 disposed between a first fin portion (including the portion 214 having carbon and a dopant co-implanted) and a second fin portion (including the seed layer 224 and/or the silicon-based layer 226). In some implementations, the fin portion 302 includes a diffusion region in which carbon from the first fin portion has diffused into the fin portion 302 (e.g., during a baking and/or annealing operation). In some implementations, the fin portion 302 is a remaining portion of the diffusion region 218 (e.g., that was not etched away during an etching process described in connection with FIG. 2F). In some implementations, the fin portion 302 is formed during an annealing and/or baking process performed after depositing the silicon-based layer 226 during which carbon from the portion 214 diffuses into the silicon-based layer 226 and is not part of the diffusion region 218. The fin portion 302 may have a concentration of carbon that is in a range of approximately 0.1% to approximately 1.5%. Additionally, or alternatively, the fin portion 302 may have a concentration of a dopant (e.g., phosphorus) in a range of approximately 0% to approximately 0.5%.

In some implementations, the fin portion 214 has a top surface at a height that is less than or equal to the height H7 of the top surface of the set of isolation structures 232. Although the second fin portion (e.g., including the seed layer 224 and/or the silicon-based layer 226) is shown having a bottom surface at the height H7, the bottom surface of the second fin portion may be below the top surface of the set of isolation structures 232 (e.g., the bottom surface of the seed layer 224 and/or the silicon-based layer 226 may be set below the top surface of the set of isolation structures 232). Based on the second fin portion being surrounded by the isolation structure, the diffusion region 302 has a reduced likelihood of extending into a channel region of the set 228 of fin structures. Additionally, or alternatively, the seed layer 224 and/or the silicon-based layer 226 may extend to, or below, the top surface of the trench structures 232 to avoid exposing the diffusion region 302 above the isolation structures 232, which diffusion region 302 may otherwise react with material later formed on top of the isolation structures. For example, the diffusion region 302 may otherwise react with (e.g., diffuse into) a gate material later formed around the set 228 of fin structures.

As shown in FIG. 3B, semiconductor device 200B differs from the semiconductor device 200 based on having a fin portion (e.g., including the seed layer 224 and/or the silicon-based layer 226) that extends below a top surface of the set of isolation structures 232. In other words, the height H6 is less than the height H7 of the isolation structures 232. In some implementations, the height H6 is less than 90% of H7. In some implementations, the height H6 is between 90% of H7 and 70% of H7. In this way, the second fin portion may have an improved likelihood of extending below the top surface of the isolation structures 232 without exposing the diffusion region 302 above the isolation structures (which may otherwise react with material later formed on top of the isolation structures). Additionally, the portion 214 may have sufficient height to function as a source/drain.

As shown in FIG. 3C, semiconductor device 200C differs from the semiconductor device 200 based on the set 230 of fin structures not having a diffusion region 220. In some implementations, an annealing and/or baking operation causes local diffusion in which the carbon does not diffuse into the silicon-based material 216 in the portion 206 of the semiconductor device 200C. In some implementations of the semiconductor device 200C, the annealing and/or baking operation may cause carbon to diffuse into the silicon-based material 216 in the portion 204 of the semiconductor device 200C. This diffusion may be removed based on etching the recessed portion 222, as described in connection with FIG. 2F.

FIGS. 3A-3C are diagrams of example semiconductor devices 200A-200C described herein. Other examples may differ from what is described with regard to FIGS. 3A-3C. The number and arrangement of devices, layers, and/or materials shown in FIGS. 3A-3C are provided as an example. In practice, there may be additional devices, layers, and/or materials, fewer devices, layers, and/or materials, different devices, layers, and/or materials, or differently arranged devices, layers, and/or materials than those shown in FIGS. 3A-3C. Additionally, features described in connection with any of FIGS. 3A-3C may be combined with features described in connection with FIGS. 3A-3C.

Figure 4:
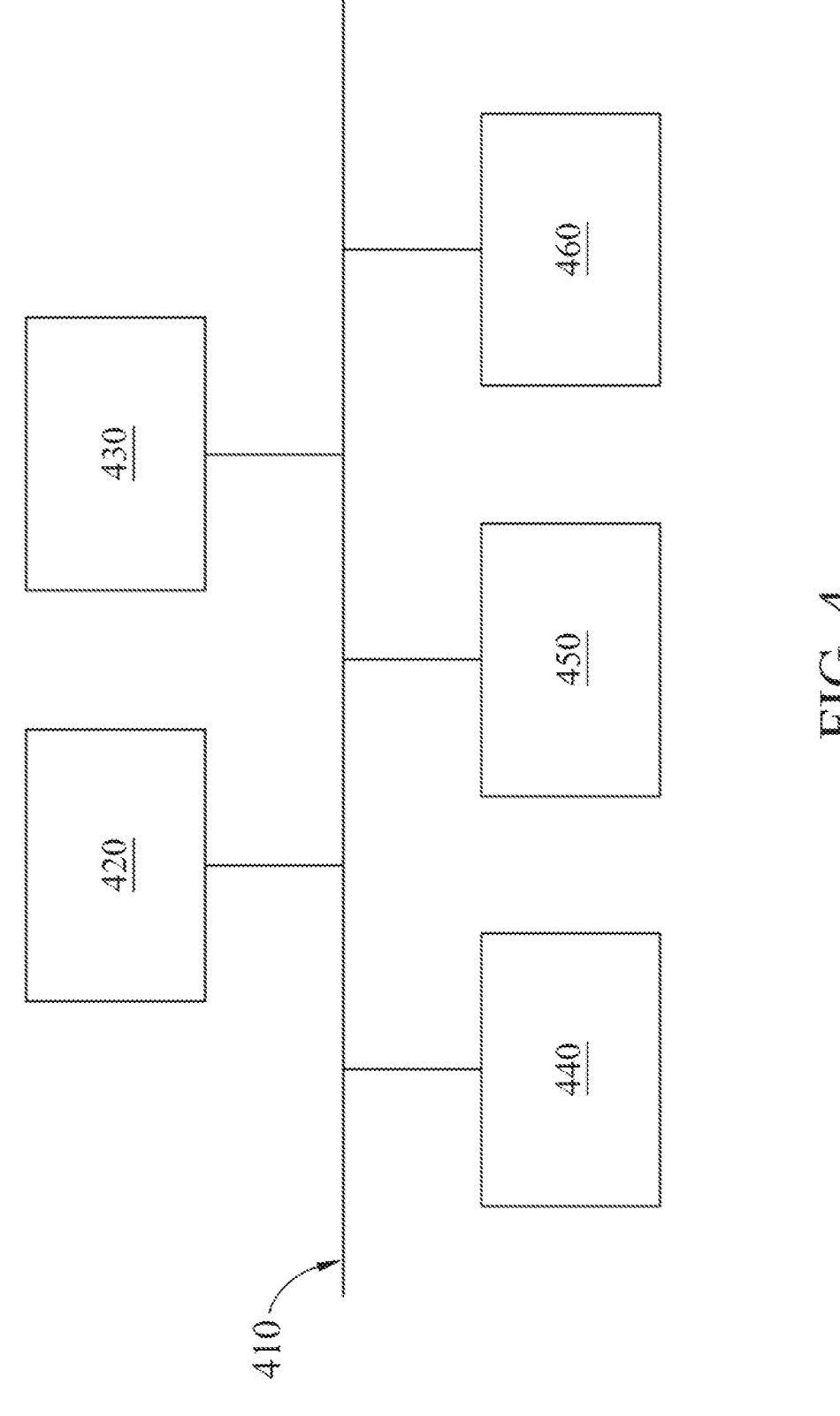
FIG. 4 is a diagram of example components of one or more devices of FIG. 1 described herein.

FIG. 4 is a diagram of example components of a device 400, which may correspond to deposition tool 102, etching tool 104, planarization tool 106, ion implantation tool 108, and/or wafer/die transport tool 110. In some implementations, deposition tool 102, etching tool 104, planarization tool 106, ion implantation tool 108, and/or wafer/die transport tool 110 may include one or more devices 400 and/or one or more components of device 400. As shown in FIG. 4, device 400 may include a bus 410, a processor 420, a memory 430, an input component 440, an output component 450, and a communication component 460.

Bus 410 includes one or more components that enable wired and/or wireless communication among the components of device 400. Bus 410 may couple together two or more components of FIG. 4, such as via operative coupling, communicative coupling, electronic coupling, and/or electric coupling. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform one or more operations or processes described elsewhere herein.

Memory 430 includes volatile and/or nonvolatile memory. For example, memory 430 may include random access memory (RAM), read only memory (ROM), a hard disk drive, and/or another type of memory (e.g., a flash memory, a magnetic memory, and/or an optical memory). Memory 430 may include internal memory (e.g., RAM, ROM, or a hard disk drive) and/or removable memory (e.g., removable via a universal serial bus connection). Memory 430 may be a non-transitory computer-readable medium. Memory 430 stores information, instructions, and/or software (e.g., one or more software applications) related to the operation of device 400. In some implementations, memory 430 includes one or more memories that are coupled to one or more processors (e.g., processor 420), such as via bus 410.

Input component 440 enables device 400 to receive input, such as user input and/or sensed input. For example, input component 440 may include a touch screen, a keyboard, a keypad, a mouse, a button, a microphone, a switch, a sensor, a global positioning system sensor, an accelerometer, a gyroscope, and/or an actuator. Output component 450 enables device 400 to provide output, such as via a display, a speaker, and/or a light-emitting diode. Communication component 460 enables device 400 to communicate with other devices via a wired connection and/or a wireless connection. For example, communication component 460 may include a receiver, a transmitter, a transceiver, a modem, a network interface card, and/or an antenna.

Device 400 may perform one or more operations or processes described herein. For example, a non-transitory computer-readable medium (e.g., memory 430) may store a set of instructions (e.g., one or more instructions or code) for execution by processor 420. Processor 420 may execute the set of instructions to perform one or more operations or processes described herein. In some implementations, execution of the set of instructions, by one or more processors 420, causes the one or more processors 420 and/or the device 400 to perform one or more operations or processes described herein. In some implementations, hardwired circuitry may be used instead of or in combination with the instructions to perform one or more operations or processes described herein. Additionally, or alternatively, processor 420 may be configured to perform one or more operations or processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

FIG. 5 is a flowchart of an example process 500 associated with manufacturing a fin structure with reduced defects. In some implementations, one or more process blocks of FIG. 5 may be performed by one or more semiconductor processing tools (e.g., deposition tool 102, etching tool 104, planarization tool 106, ion implantation tool 108, and/or wafer/die transport tool 110). Additionally, or alternatively, one or more process blocks of FIG. 5 may be performed by one or more components of device 400, such as processor 420, memory 430, input component 440, output component 450, and/or communication component 460.

As shown in FIG. 5, process 500 may include implanting a dopant and carbon in a portion of a substrate of a semiconductor device (block 510). For example, the one or more semiconductor processing tools may implant a dopant and carbon in a portion 214 of a substrate 202 of a semiconductor device 200, as described above.

As further shown in FIG. 5, process 500 may include depositing a first silicon-based layer on the portion of the substrate, the first silicon-based layer reacting with the carbon to form a diffusion region on the portion of the substrate (block 520). For example, the one or more semiconductor processing tools may deposit a first silicon-based layer 216 on the portion 214 of the substrate 202, the first silicon-based layer 216 reacting with the carbon to form a diffusion region 218 on the portion 214 of the substrate 202, as described above.

As further shown in FIG. 5, process 500 may include forming a recessed portion of the semiconductor device, the recessed portion extending through the first silicon-based layer and the diffusion region and partially extending into the portion of the substrate (block 530). For example, the one or more semiconductor processing tools may form a recessed portion 222 of the semiconductor device 200, the recessed portion 222 extending through the first silicon-based layer 216 and the diffusion region 218 and partially extending into the portion 214 of the substrate 202, as described above.

As further shown in FIG. 5, process 500 may include depositing a second silicon-based layer within the recessed portion (block 540). For example, the one or more semiconductor processing tools may deposit a second silicon-based layer 226 within the recessed portion, as described above.

As further shown in FIG. 5, process 500 may include etching one or more portions of the second silicon-based layer and the portion of the substrate to form a set of fin structures that include the second silicon-based layer and the portion of the substrate having the dopant and the carbon implanted (block 550). For example, the one or more semiconductor processing tools may etch one or more portions of the second silicon-based layer 226 and the portion 214 of the substrate 202 to form a set 228 of fin structures that include the second silicon-based layer 226 and the portion 214 of the substrate 202 having the dopant and the carbon implanted, as described above.

Process 500 may include additional implementations, such as any single implementation or any combination of implementations described below and/or in connection with one or more other processes described elsewhere herein.

In a first implementation, the set of fin structures comprises a set of p-type fin structures, and wherein portion of the substrate having the dopant and the carbon implanted comprises silicon material doped with an n-type dopant.

In a second implementation, alone or in combination with the first implementation, process 500 includes forming a set of isolation structures between fin structures of the set of fin structures, wherein a top surface of the set of isolation structures extends to a first height above the substrate that is greater than or equal to a second height of a bottom surface of the second silicon-based layer.

In a third implementation, alone or in combination with one or more of the first and second implementations, depositing the second silicon-based layer comprises depositing a seed layer that includes a bottom surface of the second silicon-based layer and has a first concentration of silicon, and depositing an upper portion on the seed layer and having a second concentration of silicon, wherein the first concentration of silicon is greater than the second concentration of silicon.

In a fourth implementation, alone or in combination with one or more of the first through third implementations, the seed layer has a concentration of germanium in a range of approximately 1% to approximately 10%, and wherein the upper portion has a concentration of germanium in a range of approximately 10% to approximately 35%.

In a fifth implementation, alone or in combination with one or more of the first through fourth implementations, the recessed portion extends into the portion of the substrate by an amount in a range of approximately 5 nanometers to approximately 10 nanometers.

In a sixth implementation, alone or in combination with one or more of the first through fifth implementations, the second silicon-based layer comprises a carbon-free silicon-based material.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIG. 6 is a flowchart of an example process 600 associated with fin structure with reduced defects and manufacturing method thereof. In some implementations, one or more process blocks of FIG. 6 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 6 may be performed by one or more components of device 400, such as processor 420, memory 430, input component 440, output component 450, and/or communication component 460.

As shown in FIG. 6, process 600 may include implanting a dopant and carbon in a portion of a substrate of a semiconductor device (block 610). For example, the one or more semiconductor processing tools may implant (e.g., co-implanting in a single-operation or multi-operation implantation process) a dopant and carbon in a portion 214 of a substrate 202 of a semiconductor device 200, as described above.

As further shown in FIG. 6, process 600 may include depositing a first silicon-based layer on the portion of the substrate, the first silicon-based layer reacting with the carbon to form a diffusion region on the portion of the substrate (block 620). For example, the one or more semiconductor processing tools may deposit a first silicon-based layer 216 on the portion 214 of the substrate 202, the first silicon-based layer 216 reacting with the carbon to form a diffusion region 218 on the portion 214 of the substrate 202, as described above.

As further shown in FIG. 6, process 600 may include etching the first silicon-based layer, the diffusion region, and the portion of the substrate to form a recessed portion of the semiconductor device that extends through the first silicon-based layer and the diffusion region and partially extends into the portion of the substrate (block 630). For example, the one or more semiconductor processing tools may etch the first silicon-based layer 216, the diffusion region 218, and the portion 214 of the substrate 202 to form a recessed portion 222 of the semiconductor device 200 that extends through the first silicon-based layer 216 and the diffusion region 218 and partially extends into the portion 214 of the substrate 202, as described above.

As further shown in FIG. 6, process 600 may include depositing a second silicon-based layer within the recessed portion (block 640). For example, the one or more semiconductor processing tools may deposit a second silicon-based layer 226 within the recessed portion 222, as described above.

Process 600 may include additional implementations, such as any single implementation or any combination of implementations described below and/or in connection with one or more other processes described elsewhere herein.

In a first implementation, the second silicon-based layer comprises silicon germanium.

In a second implementation, alone or in combination with the first implementation, the dopant comprises an n-type dopant.

In a third implementation, alone or in combination with one or more of the first and second implementations, process 600 includes implanting (e.g., co-implanting in a single-operation or multi-operation implantation process) an additional dopant and the carbon in an additional portion of the substrate, depositing the first silicon-based layer on the additional portion of the substrate, forming a set of fin structures from the second silicon-based layer on the portion of the substrate, and forming an additional set of fin structures from the first silicon-based layer on the additional portion of the substrate.

In a fourth implementation, alone or in combination with one or more of the first through third implementations, the recessed portion extends into the portion of the substrate with a height, relative to a top surface of the substrate, in a range of approximately 5 nanometers to approximately 10 nanometers.

In a fifth implementation, alone or in combination with one or more of the first through fourth implementations, process 600 includes baking the semiconductor device after co-implanting the dopant and the carbon and before depositing the first silicon-based layer.

In a sixth implementation, alone or in combination with one or more of the first through fifth implementations, the recessed portion has a height, relative to a top surface of the substrate, in a range of approximately 120% to approximately 140% of a height of a sum of a height of the first silicon-based layer and a height of the diffusion region.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

FIG. 7 is a flowchart of an example process 700 associated with fin structure with reduced defects and manufacturing method thereof. In some implementations, one or more process blocks of FIG. 7 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 7 may be performed by one or more components of device 400, such as processor 420, memory 430, input component 440, output component 450, and/or communication component 460.

As shown in FIG. 7, process 700 may include forming a first set of fin structures on a substrate of a semiconductor device, a first fin structure of the first set of fin structures comprising: a first fin portion including an n-type dopant and carbon co-implanted in a first silicon-based material, and a second fin portion, disposed above the first fin portion, including a first carbon-free silicon-based material, wherein a bottom surface of the second fin portion is at a first height above the substrate (block 710). For example, the one or more semiconductor processing tools may form a first set 228 of fin structures on a substrate 202 of a semiconductor device 200, a first fin structure of the first set 228 of fin structures comprising: a first fin portion 214 including an n-type dopant and carbon co-implanted in a first silicon-based material, and a second fin portion 226 and/or 224, disposed above the first fin portion 214, including a first carbon-free silicon-based material, wherein a bottom surface of the second fin portion 226 and/or 224 is at a first height above the substrate 202, as described above.

As further shown in FIG. 7, process 700 may include forming a second set of fin structures on the substrate, a second fin structure of the second set of fin structures comprising: a third fin portion including a p-type dopant and carbon co-implanted in a second silicon-based material, and a fourth fin portion, disposed above the third fin portion, including a second carbon-free silicon-based material, wherein a bottom surface of the fourth fin portion is at a second height above the substrate, and wherein the second height is greater than the first height (block 720). For example, the one or more semiconductor processing tools may form a second set 230 of fin structures on the substrate 202, a second fin structure of the second set 230 of fin structures comprising: a third fin portion 210 including a p-type dopant and carbon co-implanted in a second silicon-based material, and a fourth fin portion 216, disposed above the third fin portion 210, including a second carbon-free silicon-based material, wherein a bottom surface of the fourth fin portion 216 is at a second height above the substrate 210, and wherein the second height is greater than the first height, as described above.

Process 700 may include additional implementations, such as any single implementation or any combination of implementations described below and/or in connection with one or more other processes described elsewhere herein.

In a first implementation, one or more of the first carbon-free silicon-based material or the second carbon-free silicon-based material has a concentration of carbon that is less than approximately 0.1%.

In a second implementation, alone or in combination with the first implementation, the first fin structure of the first set of fin structures comprises a fifth fin portion, disposed between the first fin portion and the second fin portion, including a diffusion region that includes carbon diffused into silicon, wherein a top surface of the fifth fin portion is at a third height above the substrate, and wherein the third height is less than or equal to a fourth height of a trench structure disposed between fin structures of the first set of fin structures.

In a third implementation, alone or in combination with one or more of the first and second implementations, the fifth fin portion has a concentration of carbon in a range of approximately 0.1% to approximately 1.5%.

In a fourth implementation, alone or in combination with one or more of the first through third implementations, the second set of fin structures comprises a diffusion region, between the third fin portion and the fourth fin portion, the diffusion region comprising one or more of a concentration of carbon in a range of approximately 0.1% to approximately 1.5%, or a concentration of boron in a range of approximately 0% to approximately 0.5%.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8E:
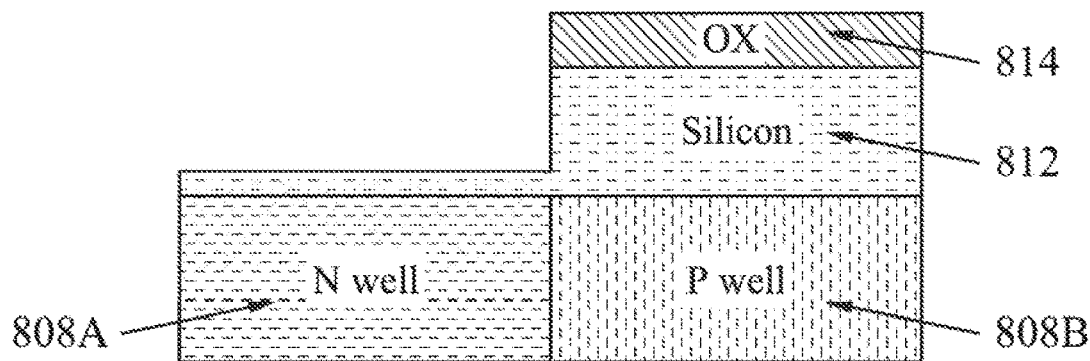
FIGS. 8A-8O are diagrams of an example implementation described herein.
Figure 8F:
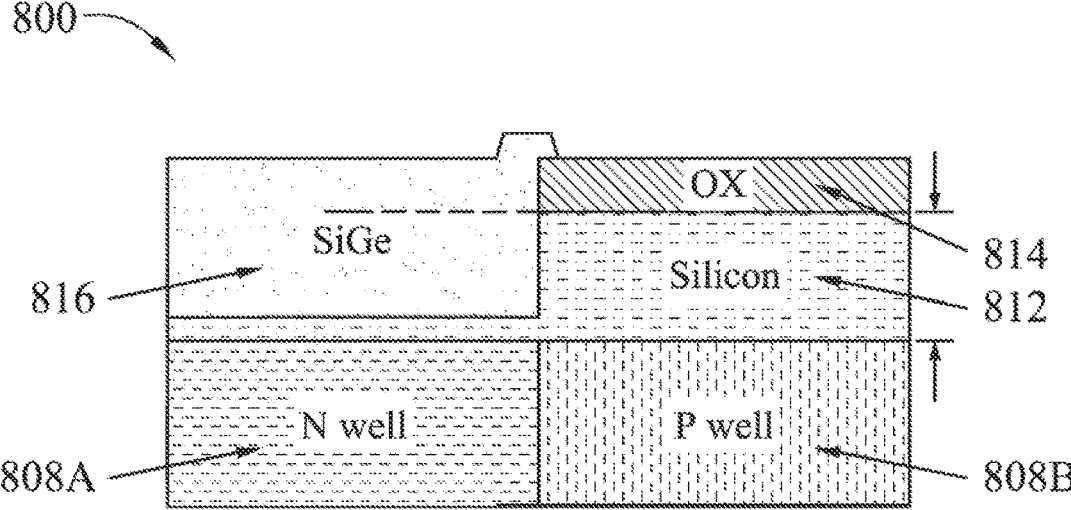
Figure 8I:
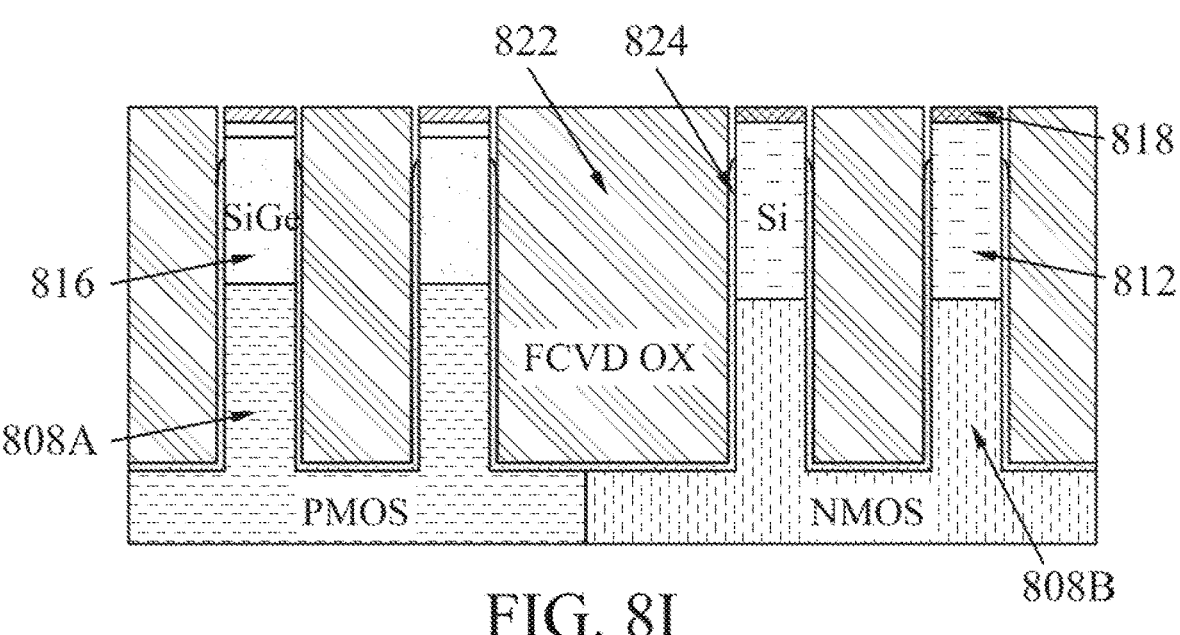
Figure 8J:
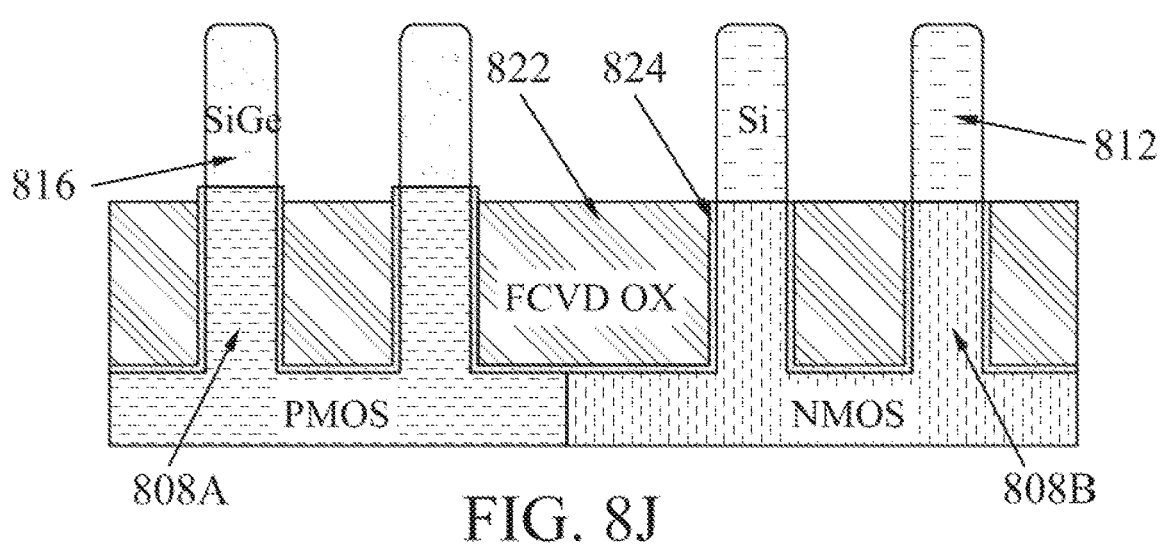
Figure 8K:
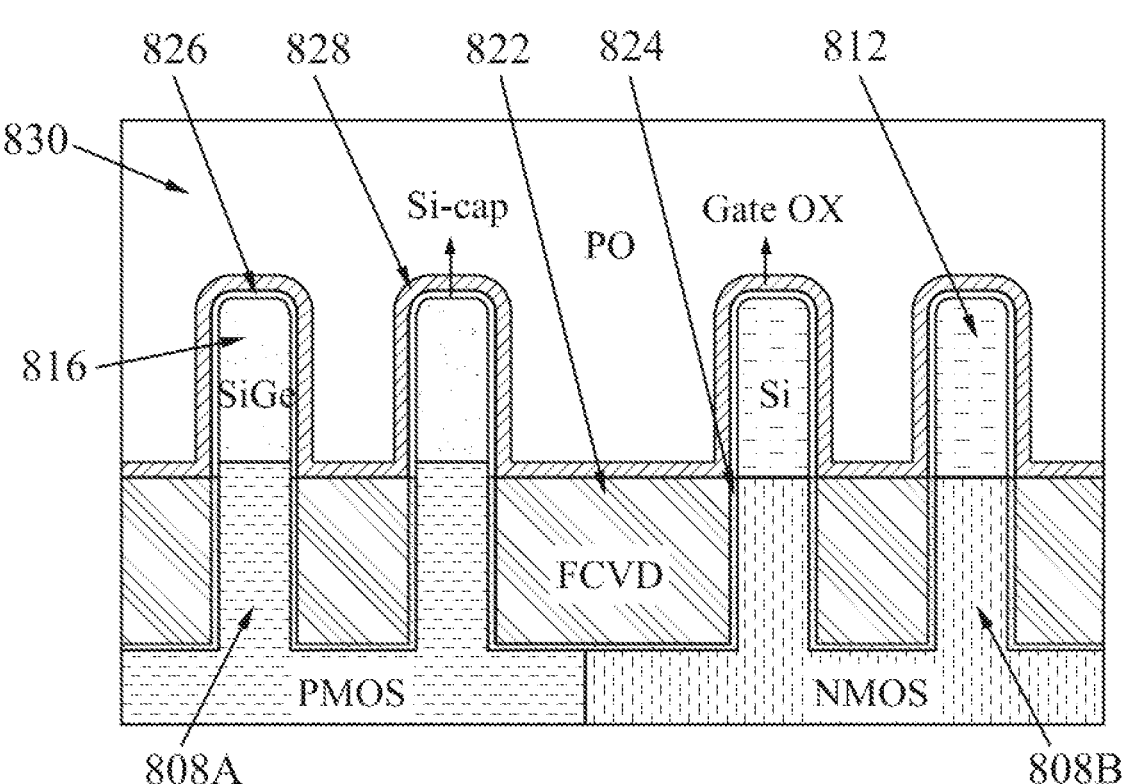
Figure 8L:
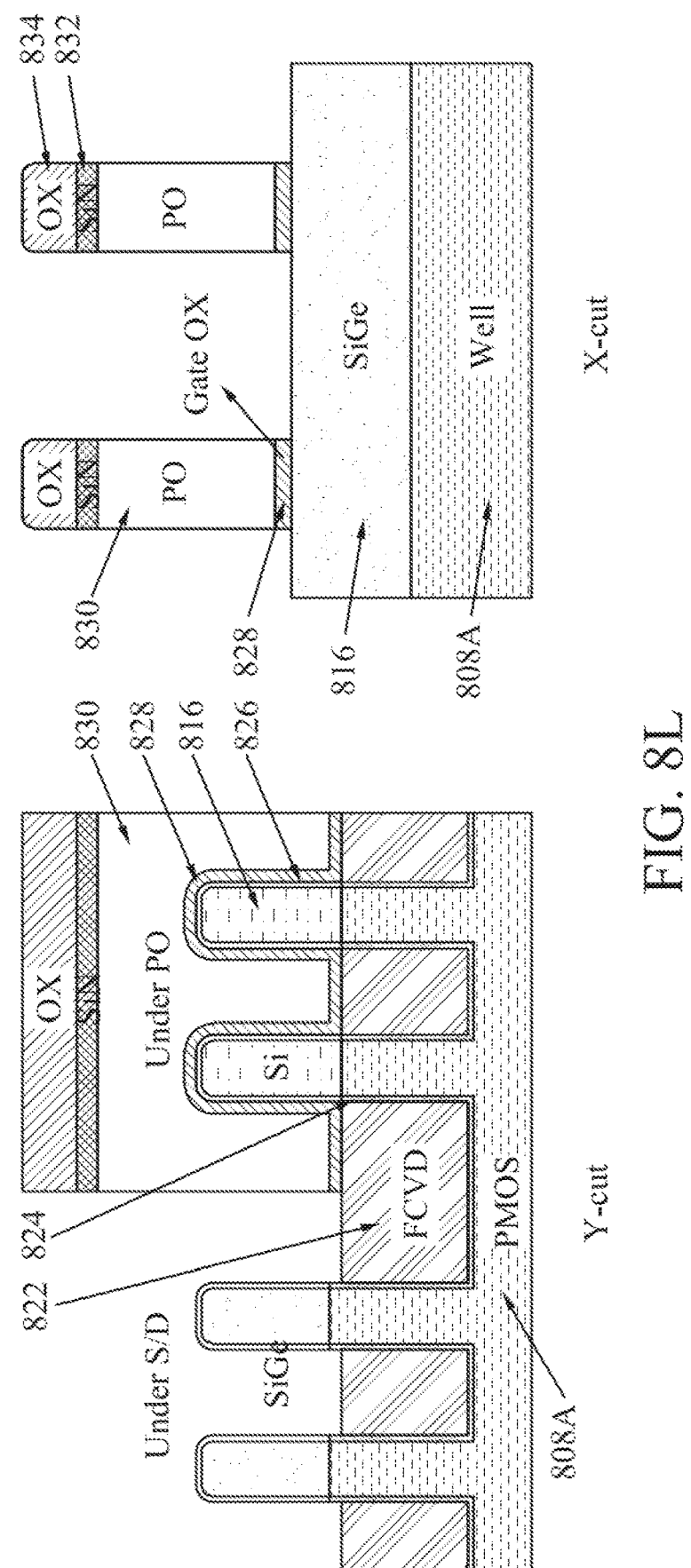
Figure 8M:
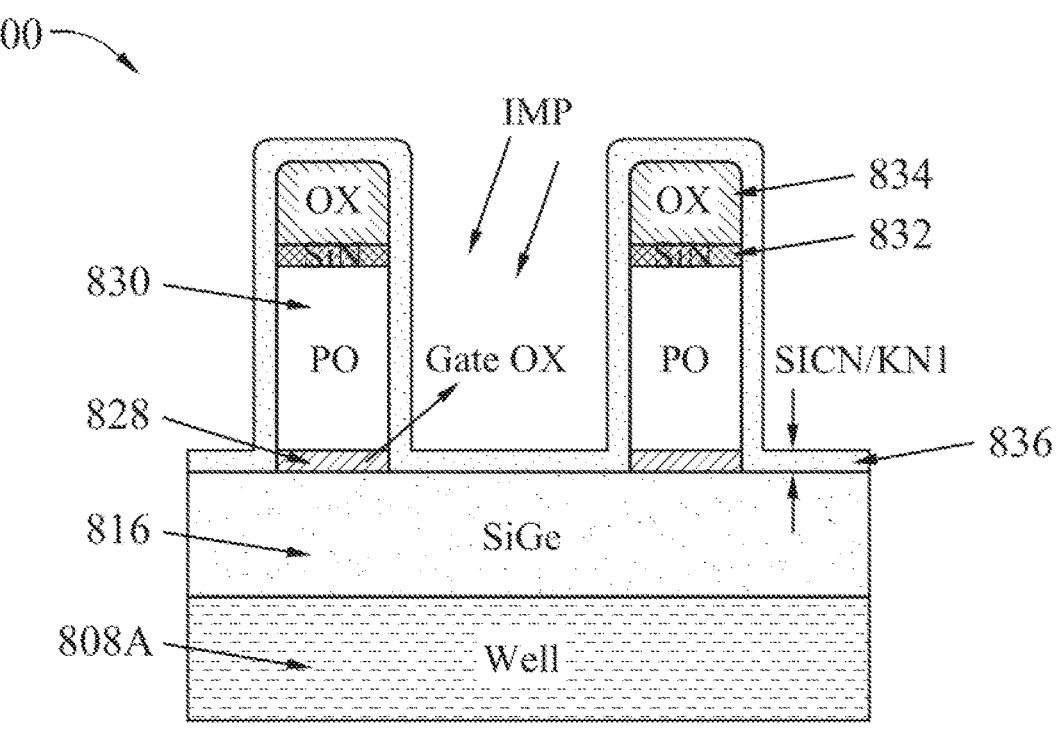
Figure 8N:
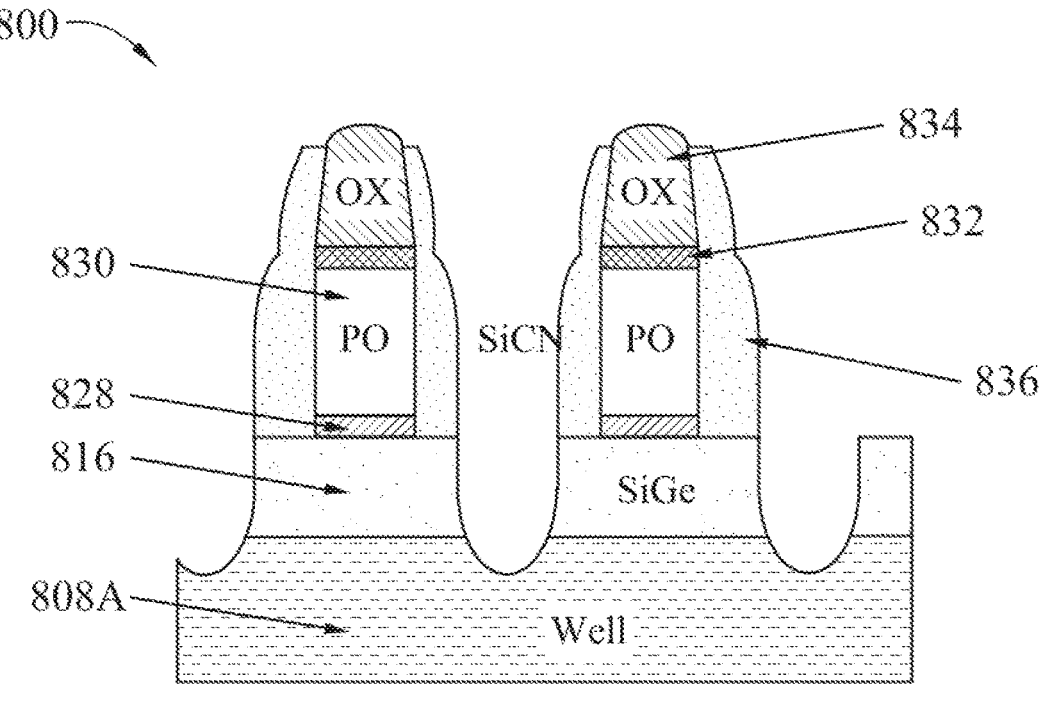
Figure 8O:
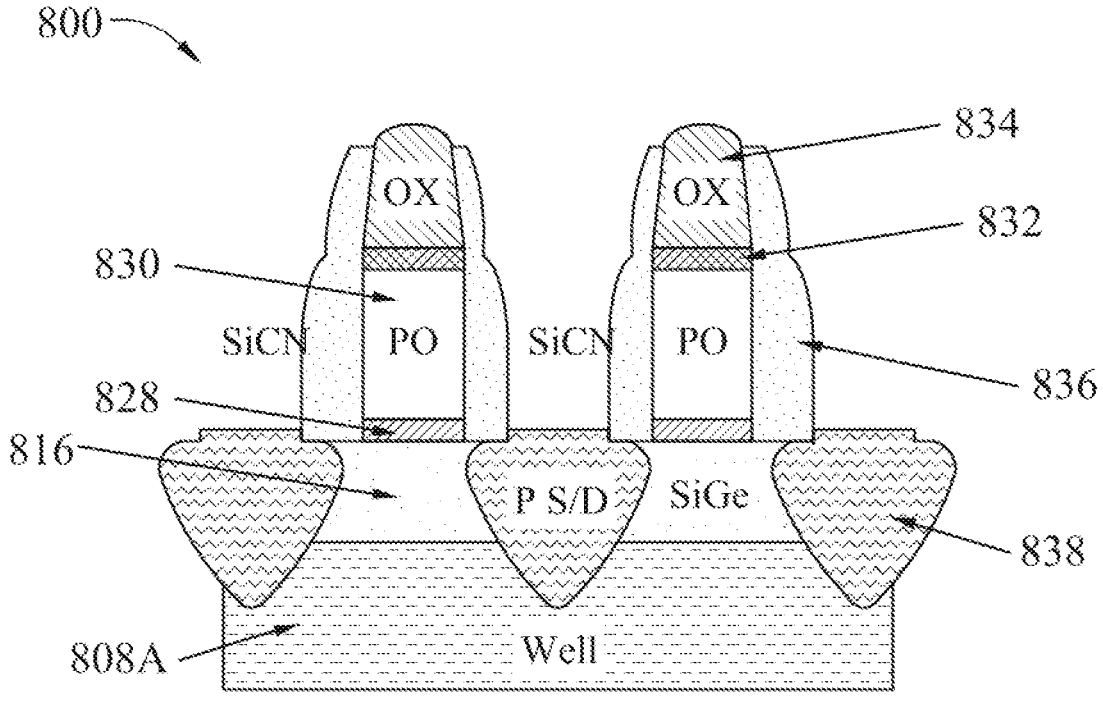

FIGS. 8A-8O are diagrams of an example implementation described herein. A semiconductor device 800 may be manufactured using an example process as shown in FIGS. 8A-8J and/or may be manufactured using one or more process features described in FIGS. 2A-2J. The example process may include one or more operations (e.g., lithography operations, operations performed on different portions of an electronic device that includes the semiconductor device 800) and/or operations shown in the example process may be performed in a different order from the order shown in FIGS. 8A-8O. The semiconductor device 800 may include one or more additional devices, structures, and/or layers not shown in FIGS. 8A-8O. For example, the semiconductor device 800 may include additional layers and/or dies formed on layers above and/or below the portion of the semiconductor device 800 shown in FIGS. 8A-8O. Additionally, or alternatively, one or more additional semiconductor structures and/or semiconductor devices may be formed in a same layer of an electronic device that includes the semiconductor device, with a lateral displacement, as the semiconductor device 800 shown in FIGS. 8A-8O. The semiconductor device 800 may be used in a FinFET structure having a narrow critical dimension (e.g., a lateral dimension as shown in FIGS. 8A-8O), such as an N3 FinFET structure.

As shown in FIG. 8A, the semiconductor device 800 may include a silicon substrate 802, a pad oxide layer 804 disposed on the silicon substrate 802, and a pad silicon nitride layer 806 disposed on the pad oxide layer 804.

As shown in FIG. 8B, one or more semiconductor processing tools may form wells 808 (e.g., an n-well and a p-well) within the silicon substrate 802. The one or more semiconductor processing tools may remove the pad silicon nitride layer 806 and deposit a photoresist 810 as part of forming the wells 808. For example, the one or more semiconductor processing tools may deposit the photoresist 810 on a first portion of the silicon substrate 802 and form a first well 808 on a second portion of the silicon substrate 802, and the one or more semiconductor processing tools may deposit the photoresist 810 on the second portion of the silicon substrate 802 and form a second well 808 on a first portion of the silicon substrate 802. The one or more semiconductor processing tools may form the wells 808 based on implanting a dopant and/or carbon. In some implementations, a first set of wells may have a first dopant and a second set of wells may have a second dopant. The one or more semiconductor processing tools may perform an annealing process after forming the wells 808. The annealing process may cause the dopant and/or the carbon to gather in an upper portion of the wells 808.

As shown in FIG. 8C, one or more semiconductor processing tools may form a silicon layer 812 on top of the wells 808 (e.g., well 808A and well 808B). For example, the one or more semiconductor processing tools may remove the pad oxide layer 804 and then deposit the silicon layer 812. The silicon layer 812 may include a pure silicon-based material (e.g., with less than 1% germanium) that is an epitaxial layer of the semiconductor device 800.

As shown in FIG. 8D, the one or more semiconductor processing tools may form a pad oxide layer 814 on the silicon layer 812 and may deposit a photoresist 816 on the pad oxide layer 814 above the well 808B.

As shown in FIG. 8E, the one or more semiconductor processing tools may form a recess through the pad oxide layer 814 and the silicon layer 812 above the well 808A. In some implementations, the recess may extend fully through, or partially through, the silicon layer 812.

As shown in FIG. 8F, the one or more semiconductor processing tools may form a silicon germanium layer 816 within the recess formed in connection with FIG. 8E. In some implementations, the one or more semiconductor processing tools deposit the silicon germanium layer 816 as an epitaxial layer of the semiconductor device 800. The silicon germanium layer 816 may be deposited to a height of a top surface of the pad oxide layer 814. The silicon germanium layer 816 may have a different thickness than the silicon layer 812.

As shown in FIG. 8G, the one or more semiconductor processing tools may polish a top surface of the semiconductor device 800. Based on polishing the top surface of semiconductor device 800, a top surface of the silicon germanium layer 816 may be approximately even with a top surface of the silicon layer 812.

As shown in FIG. 8H, the one or more semiconductor processing tools may deposit a pad oxide layer 818 and a pad silicon nitride layer 820 in a pattern on the top surface of the semiconductor device 800. The one or more semiconductor processing tools may remove portions of the silicon germanium layer 816, the well 808A, the silicon layer 812, and the well 808B based on the pattern. Based on removing the portions of materials, the one or more semiconductor processing tools form the materials into fin structures.

As shown in FIG. 8I, the one or more semiconductor processing tools may deposit an oxide material 822 as an isolation structure between the fin structures. For example, the one or more semiconductor processing tools may deposit the oxide material 822 using flowable chemical vapor deposition (FCVD). In some implementations, the one or more semiconductor processing tools deposit a silicon nitride liner 824 on sidewalls of the fin structures and top surfaces of the well 808A and the well 808B before depositing the oxide material 822.

As shown in FIG. 8J, the one or more semiconductor processing tools may remove a portion of the oxide material 822 and/or the silicon nitride liner 824 from upper portions of the fin structures. For example, the oxide material 822 and/or the silicon nitride liner 824 may be removed from portions of the fin structures that are above the well 808A and the well 808B. In some implementations, the oxide material 822 and/or the silicon nitride liner 824 may be removed from the portions of the fin structures that include the silicon germanium layer 816 and the silicon layer 812. In some implementations, the oxide material 822 and/or the silicon nitride liner 824 may have a height such that the oxide material 822 and/or the silicon nitride liner 824 extend upward sufficiently to surround a diffusion region of the silicon germanium-based fin structures.

As shown in FIG. 8K, the one or more semiconductor processing tools may form a silicon cap 826 on portions of the fin structures that are exposed above the oxide material

822. The one or more semiconductor processing tools may form a gate oxide layer 828 on the oxide material 822, side walls of the fin structures, and a top surface of the fin structures. After depositing the gate oxide layer 828, the one or more semiconductor processing tools may deposit a polysilicon structure on the gate oxide layer 828 (e.g., between the fin structures and/or above the fin structures).

FIG. 8L shows a Y-cut view (e.g., as shown in FIGS. 8A-8K) and an X-cut view that is a cross sectional view of a silicon germanium fin structure (with the X-cut view being orthogonal to the Y-cut view). As shown in FIG. 8L, a portion of the gate oxide layer 828 and the polysilicon structure 830 may be removed from a source/drain portion of the well 808A that includes fin structures (e.g., using a pad silicon nitride layer 832 and/or a pad oxide layer 834). In a gate portion of the well 808A the gate oxide layer 828 and the polysilicon structure 830 form one or more gate stacks on the silicon germanium layer 816 (e.g., a silicon germanium fin structure).

As shown in FIG. 8M (e.g., the X-cut view), the one or more semiconductor processing tools may deposit a silicon carbon nitride layer 836 on the one or more gate stacks and on the silicon germanium fin structure. In some implementations, the one or more semiconductor processing tools may form the silicon carbon nitride layer 836 based on implanting carbon into a silicon nitride layer disposed on the one or more gate stacks and on the silicon germanium fin structure.

As shown in FIG. 8N, the one or more semiconductor processing tools may etch between the one or more gate stacks to form a recessed portion that extends to the well 208A. For example, the one or more semiconductor processing tools may etch through the silicon carbon nitride layer 836 and the silicon germanium layer 816, and partially through the well 808A.

As shown in FIG. 8O, the one or more semiconductor processing tools may form source/drains 838 within the recessed portion formed in connection with FIG. 8N. In some implementations, the source/drains 838 are formed laterally between the one or more gate stacks and at least partially within the silicon germanium fin structure (e.g., at a lower layer than the one or more gate stacks).

As indicated above, FIGS. 8A-8O are provided as an example. Other examples may differ from what is described with regard to FIGS. 8A-8O. The number and arrangement of devices, layers, and/or materials shown in FIGS. 8A-8O are provided as an example. In practice, there may be additional devices, layers, and/or materials, fewer devices, layers, and/or materials, different devices, layers, and/or materials, or differently arranged devices, layers, and/or materials than those shown in FIGS. 8A-8O.

In this way, a semiconductor device may have fin structures with improved source/drain electron tunneling and/or improved short channel effect. Further, the semiconductor device may have reduced cluster damage defects that may otherwise cause uneven layers in materials disposed above the fin structure. Based on these features, the semiconductor device described herein may have a reduced likelihood of failure, which may reduce consumption of manufacturing resources and/or consumption of materials to manufacture a number of functioning semiconductor devices.

As described in greater detail above, some implementations described herein provide a method. The method includes implanting a dopant and carbon in a portion of a substrate of a semiconductor device. The method also includes depositing a first silicon-based layer on the portion of the substrate, the first silicon-based layer reacting with the carbon to form a diffusion region on the portion of the substrate. The method further includes forming a recessed portion of the semiconductor device, the recessed portion extending through the first silicon-based layer and the diffusion region and partially extending into the portion of the substrate. The method additionally includes depositing a second silicon-based layer within the recessed portion. The method further includes etching one or more portions of the second silicon-based layer and the portion of the substrate to form a set of fin structures that include the second silicon-based layer and the portion of the substrate having the dopant and the carbon implanted.

As described in greater detail above, some implementations described herein provide a method. The method includes co-implanting a dopant and carbon in a portion of a substrate of a semiconductor device. The method also includes depositing a first silicon-based layer on the portion of the substrate, the first silicon-based layer reacting with the carbon to form a diffusion region on the portion of the substrate. The method additionally includes etching the first silicon-based layer, the diffusion region, and the portion of the substrate to form a recessed portion of the semiconductor device that extends through the first silicon-based layer and the diffusion region and partially extends into the portion of the substrate. The method further includes depositing a second silicon-based layer within the recessed portion.

As described in greater detail above, some implementations described herein provide a method. The method includes forming a first set of fin structures on a substrate of a semiconductor device, a first fin structure of the first set of fin structures comprising a first fin portion including an n-type dopant and carbon co-implanted in a first silicon-based material, and a second fin portion, disposed above the first fin portion, including a first carbon-free silicon-based material, where a bottom surface of the second fin portion is at a first height above the substrate. The method includes forming a second set of fin structures on the substrate, a second fin structure of the second set of fin structures comprising a third fin portion including a p-type dopant and carbon co-implanted in a second silicon-based material, and a fourth fin portion, disposed above the third fin portion, including a second carbon-free silicon-based material, where a bottom surface of the fourth fin portion is at a second height above the substrate, and where the second height is greater than the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   implanting a first dopant and carbon in a first portion of a substrate of a semiconductor device;
   implanting a second dopant and carbon in a second portion of the substrate;
   depositing a first silicon-based layer on the first portion of the substrate and the second portion of the substrate;
   etching a recessed portion extending through the first silicon-based layer, wherein the recessed portion extends into the first portion of the substrate;

depositing a seed layer in the recessed portion, wherein the seed layer lines side surfaces and a bottom surface of the recessed portion;

depositing a second silicon-based layer within the recessed portion, wherein the second silicon-based layer is deposited on the seed layer;

forming a plurality of fin structures based on etching one or more portions of the first silicon-based layer, the first portion of the substrate, the second silicon-based layer, the seed layer, and the second portion of the substrate; and forming a set of isolation structures disposed between fin structures of the plurality of fin structures, wherein each fin structure of a first subset of the plurality of fin structures includes a first diffusion region between part of the first portion of the substrate and part of the seed layer, wherein the first diffusion region includes carbon diffused into silicon and has a top surface at a first height above the substrate, wherein each fin structure of a second subset of the plurality of fin structures includes a second diffusion region between part of the second portion of the substrate and part of the first silicon-based layer, wherein the second diffusion region includes carbon diffused into silicon and has a top surface at a second height above the substrate, wherein the first height is less than or equal to a third height of an isolation structure of the set of isolation structures and the second height is greater than or equal to the third height, wherein a bottom surface of the second diffusion region is at a fourth height above the substrate, and wherein the fourth height is greater than or equal to the third height.

2. The method of claim 1, wherein the first subset of the plurality of fin structures comprises p-type fin structures, and wherein the first portion of the substrate comprises silicon material doped with an n-type dopant.

3. The method of claim 1, wherein the recessed portion extends into the first portion of the substrate by an amount in a range of 5 nanometers to 10 nanometers.

4. The method of claim 1, wherein the second silicon-based layer comprises a carbon-free silicon-based material.

5. A method, comprising:

implanting a first dopant and carbon in a first portion of a substrate of a semiconductor device;

implanting a second dopant and carbon in a second portion of the substrate;

depositing a first silicon-based layer on the first portion of the substrate and the second portion of the substrate;

etching a recessed portion extending through the first silicon-based layer, wherein the recessed portion extends into the first portion of the substrate;

depositing a seed layer in the recessed portion, wherein the seed layer lines side surfaces and a bottom surface of the recessed portion;

depositing a second silicon-based layer within the recessed portion, wherein the second silicon-based layer is deposited on the seed layer;

etching the second silicon-based layer, the seed layer, the first portion of the substrate, the first silicon-based layer, and the second portion of the substrate to form a plurality of fin structures; and forming a set of isolation structures disposed between fin structures of the plurality of fin structures, wherein each fin structure of a first subset of the plurality of fin structures includes a first diffusion region between part of the first portion of the substrate and part of the seed layer, wherein the first diffusion region includes carbon diffused into silicon and has a top surface at a first height above the substrate, wherein each fin structure of a second subset of the plurality of fin structures includes a second diffusion region between part of the second portion of the substrate and part of the first silicon-based layer, wherein the second diffusion region includes carbon diffused into silicon and has a top surface at a second height above the substrate, wherein the first height is less than or equal to a third height of an isolation structure of the set of isolation structures and the second height is greater than or equal to the third height, wherein a bottom surface of the second diffusion region is at a fourth height above the substrate, and wherein the fourth height is greater than or equal to the third height.

6. The method of claim 5, wherein the first dopant comprises an n-type dopant.

7. The method of claim 5, wherein the recessed portion extends into the first portion of the substrate with a height, relative to a top surface of the substrate, in a range of 5 nanometers to 10 nanometers.

8. The method of claim 5, further comprising:

baking the semiconductor device after co-implanting the first dopant and the carbon in the first portion of the substrate and before depositing the first silicon-based layer.

9. The method of claim 5, wherein the recessed portion has a height, relative to a top surface of the substrate, in a range of 120% to 140% of a height of a sum of a height of the first silicon-based layer and a height of the first diffusion region.

10. The method of claim 5, wherein the seed layer comprises one or more of:

pure silicon, lightly doped silicon, or gradient silicon.

11. A method, comprising:

forming a first set of fin structures on a substrate of a semiconductor device, a first fin structure of the first set of fin structures comprising:

a first fin portion including an n-type dopant and carbon co-implanted in a first silicon-based material a second fin portion, disposed above the first fin portion, including a first carbon-free silicon-based material, and a third fin portion, disposed between the first fin portion and the second fin portion, including a diffusion region that includes carbon diffused into silicon, wherein a top surface of the third fin portion is at a first height above the substrate, and wherein the first height is less than or equal to a second height of a trench structure disposed between fin structures of the first set of fin structures; and forming a second set of fin structures on the substrate, a second fin structure of the second set of fin structures comprising:

a fourth fin portion including a p-type dopant and carbon co-implanted in a second silicon-based material, a fifth fin portion, disposed above the fourth fin portion, including a second carbon-free silicon-based material, and a sixth fin portion, disposed between the fourth fin portion and the fifth fin portion, including a diffusion region that includes carbon diffused into silicon, wherein a bottom surface of the sixth fin portion is at a third height above the substrate, and wherein the third height is greater than or equal to a fourth height of a trench structure disposed between fin structures of the second set of fin structures.

12. The method of claim 11, wherein one or more of the first carbon-free silicon-based material or the second carbon-free silicon-based material has a concentration of carbon that is less than 0.1%.

13. The method of claim 11, wherein the second height is equal to the fourth height.

14. The method of claim 11, wherein the third fin portion has a concentration of carbon in a range of 0.1% to 1.5%.

15. The method of claim 13, wherein the diffusion region of the sixth fin portion comprises one or more of:

a concentration of carbon in a range of 0.1% to 1.5%, or a concentration of boron in a range of 0% to 0.5%.

16. The method of claim 1, wherein the first silicon-based layer reacts with the carbon in the first portion of the substrate to form the first diffusion region on the first portion of the substrate.

17. The method of claim 1, wherein the second silicon-based layer reacts with the carbon in the first portion of the substrate to form the first diffusion region on the first portion of the substrate.

18. The method of claim 5, further comprising:

baking or annealing the semiconductor device after depositing the second silicon-based layer, wherein the second silicon-based layer reacts with the carbon in the first portion of the substrate, during the baking or the annealing, to form the first diffusion region on the first portion of the substrate.

19. The method of claim 1, wherein the first silicon-based layer reacts with the carbon in the second portion of the substrate to form the second diffusion region on the second portion of the substrate.

20. The method of claim 5, wherein the first silicon-based layer reacts with the carbon in the second portion of the substrate to form the second diffusion region on the second portion of the substrate.

* * * * *